US009601357B2

(12) United States Patent
Hashimoto et al.

(10) Patent No.: US 9,601,357 B2
(45) Date of Patent: Mar. 21, 2017

(54) SUBSTRATE PROCESSING DEVICE AND SUBSTRATE PROCESSING METHOD

(75) Inventors: Koji Hashimoto, Kyoto (JP); Masahiro Miyagi, Kyoto (JP); Mitsukazu Takahashi, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 14/383,817

(22) PCT Filed: Sep. 7, 2012

(86) PCT No.: PCT/JP2012/072923
§ 371 (c)(1),
(2), (4) Date: Sep. 8, 2014

(87) PCT Pub. No.: WO2013/145371
PCT Pub. Date: Oct. 3, 2013

(65) Prior Publication Data
US 2015/0090694 A1    Apr. 2, 2015

(30) Foreign Application Priority Data
Mar. 30, 2012  (JP) .................................. 2012-079913

(51) Int. Cl.
*C03C 15/00* (2006.01)
*H01L 21/67* (2006.01)
*H01L 21/677* (2006.01)

(52) U.S. Cl.
CPC .... *H01L 21/6704* (2013.01); *H01L 21/67051* (2013.01); *H01L 21/67057* (2013.01); *H01L 21/67751* (2013.01)

(58) Field of Classification Search
USPC ........................ 216/83; 156/345.33; 118/715
See application file for complete search history.

(56) References Cited

U.S. PATENT DOCUMENTS 7,067,033 B2 *  6/2006  Ito ........................... B05C 11/06
                                                      134/184
7,964,042 B2 *  6/2011  Kojimaru .......... H01L 21/67034
                                                      134/148
(Continued)

FOREIGN PATENT DOCUMENTS

CN         101154560 A        4/2008
JP         2002-075943        3/2002
(Continued)

OTHER PUBLICATIONS

International Search Report mailed Nov. 20, 2012 in corresponding PCT International Application No. PCT/JP2012/072923.
(Continued)

*Primary Examiner* — Binh X Tran
*Assistant Examiner* — Maki Angadi
(74) *Attorney, Agent, or Firm* — Ostrolenk Faber LLP

(57) ABSTRACT

A substrate processing apparatus and method includes, a plate that has a size equal to or larger than a principal face of the substrate, and has a horizontal and flat liquid holding face opposing the principal face of the substrate from below. A processing liquid supply unit supplies a processing liquid to the liquid holding face. A control unit controls the processing liquid supply unit and a movement unit to supply the processing liquid to the liquid holding face to form a processing liquid film, a contact step of bringing the principal face of the substrate and the liquid holding face close to each other to bring the principal face of the substrate into contact with the processing liquid film, and a liquid contact maintenance step of maintaining the processing liquid in contact with the principal face of the substrate.

20 Claims, 24 Drawing Sheets

(56) References Cited

U.S. PATENT DOCUMENTS

| | | | |
|---|---|---|---|
| 8,109,282 B2* | 2/2012 | Miya | H01L 21/67028 134/102.1 |
| 2003/0024645 A1* | 2/2003 | Orii | B08B 3/02 156/345.33 |
| 2003/0160022 A1 | 8/2003 | Wang et al. | 216/2 |
| 2007/0113872 A1 | 5/2007 | Uchida et al. | 134/26 |
| 2008/0078426 A1 | 4/2008 | Miya et al. | 134/30 |
| 2010/0247761 A1* | 9/2010 | Hashimoto | H01L 21/67051 427/240 |

FOREIGN PATENT DOCUMENTS

| JP | 2003-045839 | | 2/2003 |
|---|---|---|---|
| JP | 2004-356593 | A | 12/2004 |
| JP | 2005-079219 | | 3/2005 |
| JP | 2005-260088 | A | 9/2005 |
| JP | 2007-165746 | A | 6/2007 |
| JP | 2008-112760 | | 5/2008 |
| JP | 2008-227386 | | 9/2008 |

OTHER PUBLICATIONS

Written Opinion mailed Nov. 20, 2012 in corresponding PCT International Application No. PCT/JP2012/072923.
International Preliminary Report on Patentability (Chapter I) with Notification from the International Bureau (Form PCT/IB/326) mailed Oct. 9, 2014 in corresponding PCT International Application No. PCT/JP2012/072923.
English translation of the International Preliminary Report on Patentability (Chapter I) with Notification from the International Bureau (Form PCT/IB/338) mailed Oct. 9, 2014 in corresponding PCT International Application No. PCT/JP2012/072923.
Office Action dated Feb. 16, 2016 in corresponding Chinese Patent Application No. 201280072046.3 (2 pages).

* cited by examiner

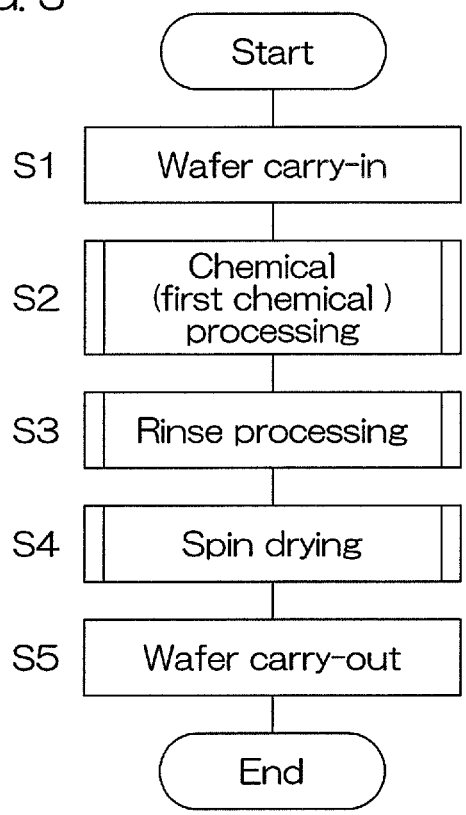

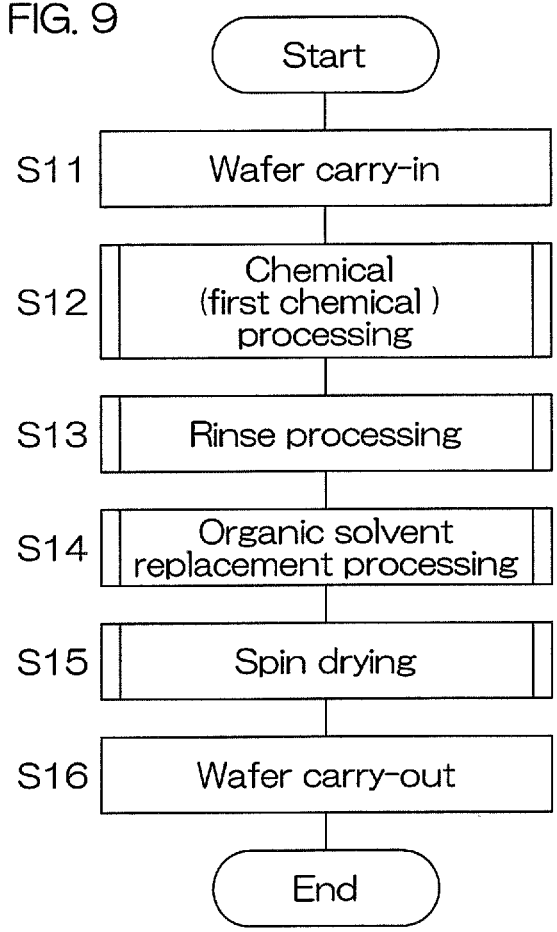

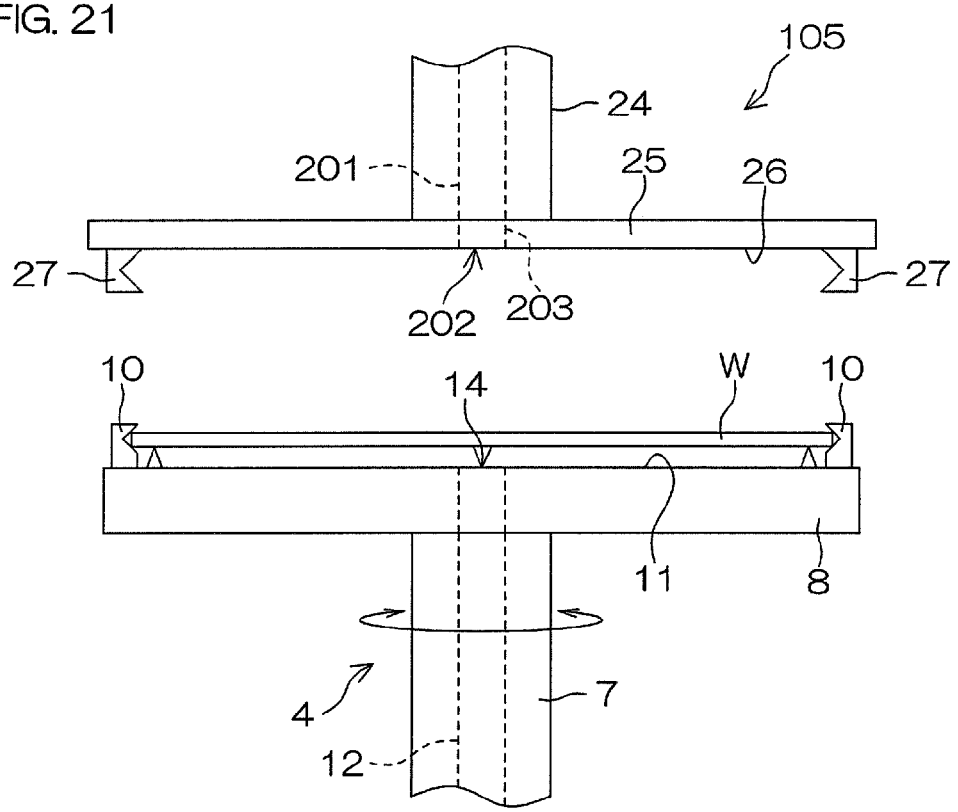

SUBSTRATE PROCESSING DEVICE AND SUBSTRATE PROCESSING METHOD

CROSS-REFERENCE TO RELATED APPLICATIONS

The present application is a 35 U.S.C. §§371 national phase conversion of PCT/JP2012/072923, filed Sep. 7, 2012, which claims priority to Japanese Application No. 2012-079913, filed Mar. 30, 2012, the contents of both of which are incorporated herein by reference. The PCT International Application was published in the Japanese language.

TECHNICAL FIELD

The present invention relates to a substrate processing apparatus and a substrate processing method for processing substrates by using a processing liquid. Examples of substrates to be processed include semiconductor wafers, glass substrates for liquid crystal displays, substrates for plasma displays, substrates for FEDs (Field Emission Displays), substrates for optical disks, substrates for magnetic disks, substrates for magneto-optical disks, substrates for photomasks, ceramic substrates, and substrates for solar cells.

BACKGROUND ART

Patent Document 1 discloses a substrate processing apparatus including a substrate holding portion that holds a substrate in a horizontal posture, and a plate that has a substrate opposing face opposing a principal face of the substrate with a predetermined gap therebetween. A discharge port for supplying a processing liquid is formed in a part of the substrate opposing face, the part opposing the center of the principal face of the substrate. The processing liquid supplied from the discharge port to a space between the principal face of the substrate and the substrate opposing face spreads in the space and brings the space into a liquid filled state.

With the arrangement, the processing liquid can be distributed to the entire principal face of the substrate at a small flow rate of the processing liquid. Therefore, consumption of the processing liquid can be suppressed, so that reduction in running costs can be realized.

CITATION LIST

Patent Document

Patent Document 1: Japanese Unexamined Patent Publication No. 2008-227386

SUMMARY OF INVENTION

Technical Problems

However, with the arrangement of Patent Document 1, the discharge port opposes the center of the principal face of the substrate, and the processing liquid discharged from the discharge port is first abutted with the center of the principal face of the substrate. Therefore, as described next, in-plane uniformity of processing cannot be realized.

FIG. 24 is a model diagram for illustrating a difference in etching processing between the rotation center (center) and a peripheral end (edge) of the substrate in a case where an etching liquid is used as the processing liquid. The horizontal axis indicates a period of time after starting discharge of the etching liquid, and the vertical axis indicates the etching amount.

When the etching liquid (processing liquid) is supplied to the rotation center of the substrate, a time difference is caused until the etching liquid reaches the peripheral end of the substrate by centrifugal force. Therefore, start of etching in the peripheral end is behind the start of etching in the rotation center. Before starting the etching in the peripheral end, the etching progresses in the rotation center by an etching amount $\Delta E$, and the etching amount $\Delta E$ results in a difference in the etching amount between the center and the edge. The difference is not eliminated even when etching liquid discharge time is extended.

The inventors of the present application found that in a case where consumption of an etching liquid is reduced by decreasing a discharge flow rate (for example, 0.25 liter/min) of the etching liquid (processing liquid), rotational speed of a substrate relates to in-plane etching uniformity of the substrate. Specifically, when the rotational speed of the substrate is high (for example, about 1000 rpm), the etching amount line in the rotation center (center) of the substrate and the etching amount line in the peripheral end (edge) of the substrate are not parallel with each other as shown in FIG. 25. Specifically, the etching rate in the rotation center is larger than the etching rate in the peripheral end. Therefore, as the etching liquid discharge time is extended, the difference in the etching amount is increased.

Such a problem, that is, the difference in the in-plane processing amount of the substrate is a common problem not only in a case where the etching liquid is used as the processing liquid but also in a case where a cleaning liquid, a resist removal liquid, or the like is used as the processing liquid.

Therefore, an object of the present invention is to provide a substrate processing apparatus and a substrate processing method capable of realizing substrate processing with high in-plane uniformity while reducing running costs.

Solution to Problem

A substrate processing apparatus according to the present invention includes a substrate holding unit that holds a substrate in a horizontal posture, a plate that has a size equal to or larger than a principal face of the substrate held by the substrate holding unit, and has a horizontal and flat liquid holding face opposing the principal face of the substrate below the principal face, a processing liquid supply unit that supplies a processing liquid to the liquid holding face, a movement unit that relatively moves the substrate holding unit and the plate to bring or separate the principal face of the substrate and the liquid holding face close to or from each other, and a control unit that controls the processing liquid supply unit and the movement unit to execute a processing liquid film forming step of supplying the processing liquid to the liquid holding face by the processing liquid supply unit to form a processing liquid film on the liquid holding face, a contact step of bringing the principal face of the substrate and the liquid holding face close to each other by the movement unit to bring the principal face of the substrate into contact with the processing liquid film, and a liquid contact maintenance step of maintaining a state where the processing liquid is in contact with the principal face of the substrate after the contact step.

According to this arrangement, by forming the processing liquid film on the liquid holding face of the plate opposing the principal face of the substrate while bringing the principal face of the substrate and the liquid holding face close to each other to bring the principal face of the substrate into contact with the processing liquid film, the entire principal face of the substrate is brought into contact with the processing liquid at the same time. Thereby, in the entire principal face of the substrate, processing by the processing liquid can be started substantially at the same time. After that, by maintaining the state where the processing liquid is in contact with the principal face as it is, the processing by the processing liquid progresses on the principal face of the substrate. After the principal face of the substrate is brought into contact with the processing liquid, the processing liquid can be supplied from the processing liquid supply unit at a small flow rate or supply of the processing liquid from the processing liquid supply unit can be stopped. Thus, consumption of the processing liquid can be suppressed without sacrificing uniformity of the processing in the principal face of the substrate. Thereby, substrate processing with high in-plane uniformity can be realized while reducing running costs.

In a preferred embodiment of the invention, a processing liquid discharge port that discharges the processing liquid is defined on the liquid holding face, and the processing liquid supply unit discharges the processing liquid through the processing liquid discharge port.

According to this arrangement, the processing liquid is supplied to the liquid holding face from the processing liquid discharge port formed on the liquid holding face. Thus, the processing liquid film is promptly formed on the liquid holding face without liquid splash.

A chemical discharge port that discharges a chemical may be defined on the liquid holding face. In this case, the processing liquid supply unit may include a chemical supply unit that discharges the chemical through the chemical discharge port. Further, a rinse liquid discharge port that discharges a rinse liquid may be defined on the liquid holding face. In this case, the processing liquid supply unit may include a rinse liquid supply unit that discharges the rinse liquid through the rinse liquid discharge port.

The substrate processing apparatus according to a preferred embodiment of the present invention further includes a plate rotation unit that rotates the plate about a rotation axis perpendicular to the liquid holding face. In this case, the processing liquid discharge port may be defined on the axis of the plate of rotation by the plate rotation unit.

Preferably, the control unit includes a low speed rotation control unit that controls the plate rotation unit to rotate the plate at low rotational speed with which the processing liquid is capable of being held between the liquid holding face and the principal face of the substrate concurrently with the liquid contact maintenance step.

According to this arrangement, by rotating the plate at low speed by the plate rotation unit, the processing liquid can be agitated. Thereby, processing unevenness in the principal face of the substrate can be eliminated, so that the in-plane uniformity of the processing can be furthermore improved.

Preferably, the control unit includes a high speed rotation control unit that controls the plate rotation unit to rotate the plate at high rotational speed with which the processing liquid is capable of being shaken off the liquid holding face after finishing the liquid contact maintenance step.

According to this arrangement, by rotating the plate at high speed by the plate rotation unit, the processing liquid on the liquid holding face is shaken off by the rotation of the plate and removed from the liquid holding face. Thereby, the processing liquid can be prevented from remaining on the liquid holding face.

Preferably, the control unit includes a unit that stops supply of the processing liquid to the liquid holding face in synchronization with execution of the contact step or before the execution of the contact step.

According to this arrangement, the supply of the processing liquid to the liquid holding face is stopped after formation of the processing liquid film. The principal face of the substrate is brought into contact with the processing liquid film in synchronization with stop of the supply of the processing liquid or after the stop of the supply of the processing liquid. Thereby, consumption of the processing liquid can be furthermore suppressed without influencing the processing of the principal face of the substrate.

A dry gas discharge port that discharges a dry gas may be defined on the liquid holding face. In this case, the dry gas discharge port may be defined on the axis of the plate of rotation by the plate rotation unit.

The substrate processing apparatus may further include a heating unit that heats the liquid holding face.

According to this arrangement, the processing liquid supplied to the liquid holding face can be heated. Thereby, the principal face of the substrate can be processed by the heated processing liquid. Thus, processing efficiency is improved, and as a result, processing time can be shortened. Thereby, the in-plane uniformity of the processing can be furthermore improved.

The processing liquid supply unit may include a chemical supply unit that supplies a chemical to the liquid holding face, and a rinse liquid supply unit that supplies a rinse liquid to the liquid holding face. In this case, the control unit may control the chemical supply unit, the rinse liquid supply unit, and the movement unit to execute a chemical film forming step of supplying the chemical to the liquid holding face by the chemical supply unit to form a chemical film on the liquid holding face, a chemical contact step of bringing the principal face of the substrate and the liquid holding face close to each other by the movement unit to bring the principal face of the substrate into contact with the chemical film, a chemical contact maintenance step of maintaining a state where the chemical is in contact with the principal face of the substrate after the chemical contact step, a separation step of separating the principal face of the substrate and the liquid holding face from each other by the movement unit, a rinse liquid film forming step of supplying the rinse liquid to the liquid holding face by the rinse liquid supply unit after the separation step to form a rinse liquid film on the liquid holding face, a rinse liquid contact step of bringing the principal face of the substrate and the liquid holding face close to each other by the movement unit to bring the principal face of the substrate into contact with the rinse liquid film, and a rinse liquid contact maintenance step of maintaining a state where the rinse liquid is in contact with the principal face of the substrate after the rinse liquid contact step.

According to this arrangement, by forming the chemical film on the liquid holding face of the plate opposing the principal face of the substrate while bringing the principal face of the substrate and the liquid holding face close to each other to bring the principal face of the substrate into contact with the chemical film, the entire principal face of the substrate is brought into contact with the chemical at the same time. Thereby, in the entire principal face of the substrate, processing by the chemical can be started substantially at the same time. Thus, consumption of the chemical can be suppressed without sacrificing uniformity of the chemical processing in the principal face of the substrate.

By forming the rinse liquid film on the liquid holding face of the plate opposing the principal face of the substrate while bringing the principal face of the substrate and the liquid holding face close to each other to bring the principal face of the substrate into contact with the rinse liquid film, the entire principal face of the substrate is brought into contact with the rinse liquid at the same time. Thereby, consumption of the rinse liquid can be suppressed.

Thereby, in each of the chemical processing and the rinse processing, substrate processing with high in-plane uniformity can be realized while reducing running costs.

The processing liquid supply unit may include a first chemical supply unit that supplies a first chemical to the liquid holding face, and a second chemical supply unit that supplies a second chemical to the liquid holding face. In this case, the control unit may control the first chemical supply unit, the second chemical supply unit, and the movement unit to execute a first chemical film forming step of supplying the first chemical to the liquid holding face by the first chemical supply unit to form a first chemical film on the liquid holding face, a first chemical contact step of bringing the principal face of the substrate and the liquid holding face close to each other by the movement unit to bring the principal face of the substrate into contact with the first chemical film, a first chemical contact maintenance step of maintaining a state where the first chemical is in contact with the principal face of the substrate after the first chemical contact step, a separation step of separating the principal face of the substrate and the liquid holding face from each other by the movement unit, a second chemical film forming step of supplying the second chemical to the liquid holding face by the second chemical supply unit after the separation step to form a second chemical film on the liquid holding face, a second chemical contact step of bringing the principal face of the substrate and the liquid holding face close to each other by the movement unit to bring the principal face of the substrate into contact with the second chemical film, and a second chemical contact maintenance step of maintaining a state where the second chemical is in contact with the principal face of the substrate after the second chemical contact step.

According to this arrangement, by forming the first chemical film on the liquid holding face of the plate opposing the principal face of the substrate while bringing the principal face of the substrate and the liquid holding face close to each other to bring the principal face of the substrate into contact with the first chemical film, the entire principal face of the substrate is brought into contact with the first chemical at the same time. Thereby, in the entire principal face of the substrate, processing by the first chemical can be started substantially at the same time. Thus, consumption of the first chemical can be suppressed without sacrificing uniformity of the first chemical processing in the principal face of the substrate.

By forming the second chemical film on the liquid holding face of the plate opposing the principal face of the substrate while bringing the principal face of the substrate and the liquid holding face close to each other to bring the principal face of the substrate into contact with the second chemical film, the entire principal face of the substrate is brought into contact with the second chemical at the same time. Thereby, in the entire principal face of the substrate, second chemical processing can be started substantially at the same time. Thus, consumption of the second chemical can be suppressed without sacrificing uniformity of the second chemical processing in the principal face of the substrate.

Thereby, in each of the first chemical processing and the second chemical processing, substrate processing with high in-plane uniformity can be realized while reducing running costs.

A substrate processing method according to the present invention is a substrate processing method to be executed in a substrate processing apparatus including a substrate holding unit that holds a substrate in a horizontal posture, including a liquid film forming step of supplying a processing liquid to a horizontal and flat liquid holding face opposing a principal face of the substrate below the principal face to form a processing liquid film on the liquid holding face, a contact step of bringing the principal face of the substrate and the liquid holding face close to each other to bring the principal face of the substrate into contact with the processing liquid film, and a liquid contact maintenance step of maintaining a state where the processing liquid is in contact with the principal face of the substrate after the contact step.

In the method, the same modifications as the invention of the substrate processing apparatus can also be implemented.

The above and still other objects, features, and effects of the present invention shall be made clear by the following description of preferred embodiments in reference to the attached drawings.

BRIEF DESCRIPTION OF DRAWINGS

FIG. 3 is a flowchart for illustrating a first processing example to be performed in the substrate processing apparatus shown in FIG. 1.

FIG. 9 is a flowchart for illustrating a second processing example to be performed in the substrate processing apparatus shown in FIG. 1.

FIG. 21 is a view showing a sixth preferred embodiment of the present invention.

DESCRIPTION OF EMBODIMENTS

Figure 1:
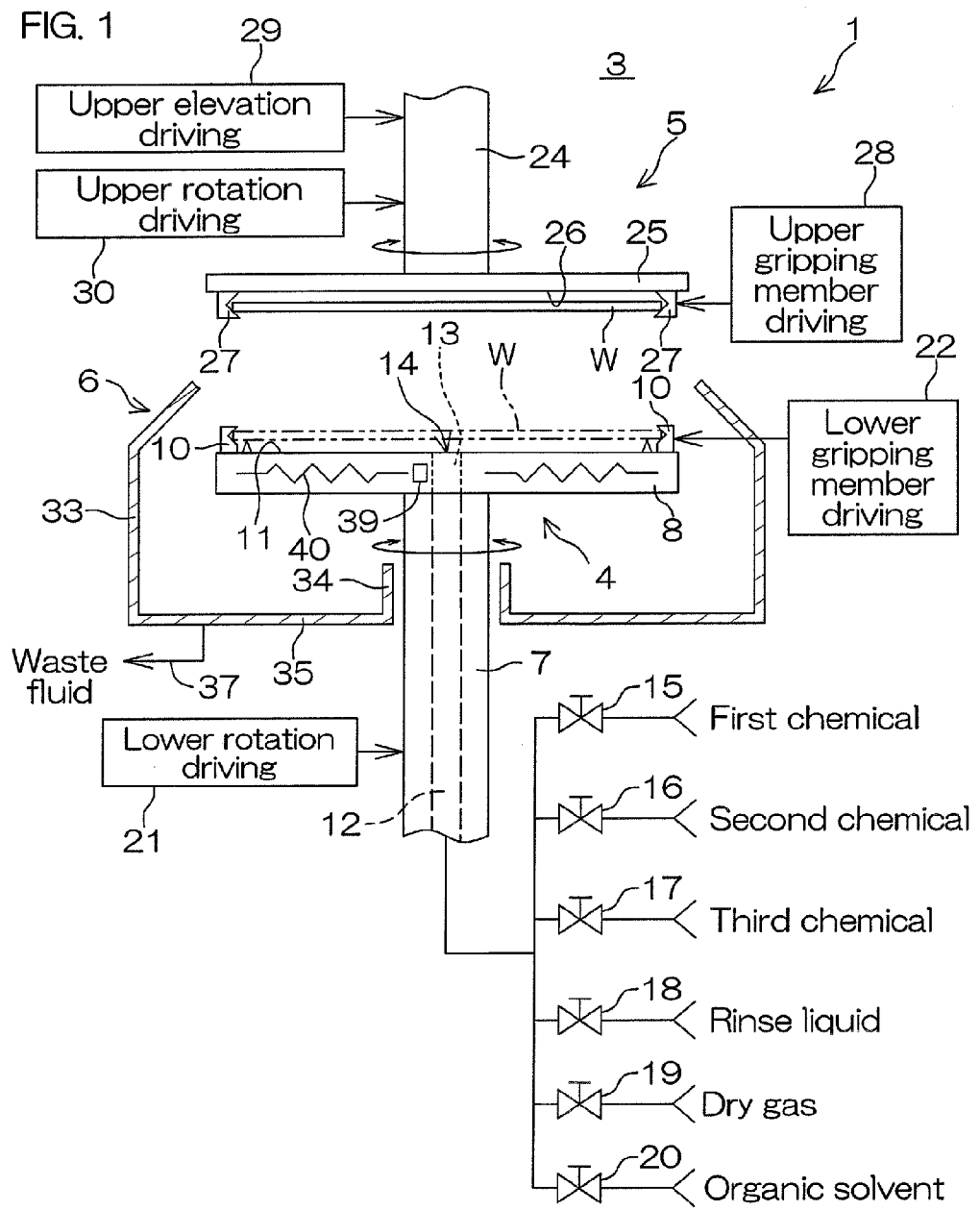
FIG. 1 is a view schematically showing an arrangement of a substrate processing apparatus according to a first preferred embodiment of the present invention.

FIG. 1 is a view schematically showing an arrangement of a substrate processing apparatus 1 according to a first preferred embodiment of the present invention.

The substrate processing apparatus 1 is a one-by-one type substrate processing apparatus that processes a circular semiconductor wafer (hereinafter, simply referred to as the "wafer") W serving as one example of a substrate, one by one by using a processing liquid (chemical (three types of chemicals including a first chemical, a second chemical, and a third chemical, for example)) and a rinse liquid (deionized water).

The substrate processing apparatus 1 includes a lower substrate holding mechanism 4 that rotates a wafer W while holding the wafer in a horizontal posture from the lower side, an upper substrate holding mechanism (substrate holding unit) 5 that is disposed above the lower substrate holding mechanism 4 and rotates the wafer W while holding the wafer in a horizontal posture, and a cup 6 that houses the lower substrate holding mechanism 4, which are arranged in a processing chamber 3 defined by a partition wall (not shown).

The lower substrate holding mechanism 4 includes a vertically-extending cylindrical lower rotational shaft 7, a disk-shaped lower spin base 8 attached to an upper end of the lower rotational shaft 7 in a horizontal posture, and a plurality of (three or more (for example, six)) lower gripping members 10 disposed at a peripheral edge of the lower spin base 8. The lower gripping members 10 are spaced at appropriate intervals on a circumference corresponding to the outer peripheral shape of the wafer W at a peripheral edge of an upper face (liquid holding face) 11 of the lower spin base 8. The lower spin base 8 is made of, for example, SiC, glass carbon, or the like. The upper face 11 of the lower spin base 8 has a substantially horizontal flat face and has a slightly larger diameter than that of the wafer W. That is, the upper face 11 of the lower spin base 8 provides a liquid holding face which is equal to or larger than the wafer W.

Further, a heater 40 that heats the upper face 11 of the lower spin base 8 is provided inside the lower spin base 8. For example, a heating resistance type heater is provided as the heater 40, and the heater 40 is arranged to heat the entire upper face 11 at a uniform temperature. By powering the heater 40, the heater 40 generates heat and uniformly heats the entire upper face 11. A temperature sensor 39 that senses a temperature of the lower spin base 8 (temperature in the vicinity of the upper face 11) is provided inside the lower spin base 8.

A lower gripping member driving mechanism 22 is coupled to the lower gripping members 10. The lower gripping member driving mechanism 22 can move the lower gripping members 10 to a grip position where the lower gripping members 10 can be abutted with an end face of the wafer W to grip the wafer W, and a release position placed on the outer side of the grip position in the radial direction of the wafer W. By gripping the wafer W by the lower gripping members 10 while the upper face 11 of the lower spin base 8 opposes a lower face of the wafer W, the wafer W is held by the lower substrate holding mechanism 4. In a state where the wafer W is held by the lower substrate holding mechanism 4, the center of the wafer W is placed on the central axis of the lower rotational shaft 7.

The lower rotational shaft 7 is a hollow shaft. A line (not shown) that delivers power to the heater 40 (heating unit) is inserted into the lower rotational shaft 7, and a lower face supply pipe 12 is also inserted into the lower rotational shaft 7. The lower face supply pipe 12 communicates with a through-hole 13 passing through a center portion of the lower spin base 8 in the thickness direction. The through-hole 13 communicates with a lower discharge port (a processing liquid discharge port, a chemical discharge port, a rinse liquid discharge port, and a dry gas discharge port) 14 that opens in a center portion of the upper face 11 of the lower spin base 8.

A first chemical of a normal temperature (about 25° C.), a second chemical of the room temperature, a third chemical of the room temperature, a rinse liquid of the room temperature such as DIW, a dry gas, and an IPA organic solvent of the room temperature are respectively supplied to the lower face supply pipe 12 via a first chemical bottom valve (chemical supply unit) 15, a second chemical bottom valve (chemical supply unit) 16, a third chemical bottom valve (chemical supply unit) 17, a rinse liquid bottom valve (rinse liquid supply unit) 18, a dry gas bottom valve (processing liquid supply unit) 19, and an organic solvent bottom valve (processing liquid supply unit) 20. The first chemical, the second chemical, the third chemical, the rinse liquid, the dry gas, and the organic solvent supplied to the lower face supply pipe 12 are discharged upward from the lower discharge port 14. In addition, although FIG. 1 shows only one lower discharge port 14, the lower discharge port 14 can have a plurality of discharge ports. In this case, a discharge port may be provided for each processing fluid or a discharge port may be shared by a plurality of processing fluids. For example, a liquid type processing fluid (the first to third chemicals, the rinse liquid, and the organic solvent) may be discharged from one discharge port and a gas type processing fluid (the dry gas) may be discharged from the other discharge port. However, any of the discharge ports included in the lower discharge port 14 is disposed on the central axis of the lower rotational shaft 7 to be described next, that is, at the center or in the vicinity of the center of the upper face 11 of the lower spin base 8.

A lower rotation driving mechanism 21 including a drive source of a motor and the like is coupled to the lower rotational shaft 7. By inputting driving force from the lower rotation driving mechanism 21 to the lower rotational shaft 7, the lower spin base 8 is rotated. Thereby, the wafer W is rotated about the vertical rotation axis passing through the center of the wafer W (central axis of the lower rotational shaft 7).

The upper substrate holding mechanism 5 includes an upper rotational shaft 24 having the rotation axis which is common to the lower rotational shaft 7 (the rotation axis on the same straight line), a disk-shaped upper spin base 25 attached to a lower end of the upper rotational shaft 24 in a horizontal posture, and a plurality of (three or more (for example, six)) upper gripping members 27 disposed at a peripheral edge of the upper spin base 25. The upper spin base 25 opposes the lower spin base 8 from above the lower spin base 8. The upper gripping members 27 are spaced at appropriate intervals on a circumference corresponding to the outer peripheral shape of the wafer W at a peripheral edge of a lower face 26 of the upper spin base 25. The lower face 26 of the upper spin base 25 has a substantially horizontal flat downward face and has a slightly larger diameter than that of the wafer W. In a state where the wafer W is held by the upper substrate holding mechanism 5, the center of the wafer W is placed on the central axis of the upper rotational shaft 24, that is, on the central axis of the lower rotational shaft 7.

The upper gripping members 27 are disposed so as not to oppose any of the lower gripping members 10 so that the upper gripping members 27 are not brought into contact with any of the lower gripping members 10 provided at the peripheral edge of the upper face 11 of the lower spin base 8 when the upper spin base 25 is disposed at a proximal position to be described later. Specifically, by controlling relative rotation positions of the upper spin base 25 and the lower spin base 8, any of the upper gripping members 27 can be prevented from opposing any of the lower gripping members 10.

An upper gripping member driving mechanism 28 is coupled to the upper gripping members 27. The upper gripping member driving mechanism 28 can move the upper gripping members 27 to a grip position where the upper gripping members 27 can be abutted with the end face of the wafer W to grip the wafer W, and a release position placed on the outer side of the grip position in the radial direction of the wafer W.

By gripping the wafer W by the upper gripping members 27 while the lower face 26 of the upper spin base 25 opposes an upper face of the wafer W, the wafer W is held by the upper substrate holding mechanism 5.

An upper elevation driving mechanism (movement unit) 29 that raises and lowers the upper spin base 25 is coupled to the upper rotational shaft 24. By the upper elevation driving mechanism 29, the upper spin base 25 is raised and lowered between a distant position where the upper spin base 25 is distanced above the lower spin base 8 (the position where the lower face 26 of the upper spin base 25 is placed above and spaced from the upper face 11 of the lower spin base 8, for example, by 15 to 20 mm, the position shown in FIG. 4D and the like to be described later), and the proximal position where the upper spin base 25 comes close to and spaced from the upper face of the wafer W held by the lower substrate holding mechanism 4 (the position shown in FIG. 4C and the like to be described later). In the preferred embodiment, the proximal position of the upper substrate holding mechanism 5 is a height position where a gap between the lower face of the wafer W held by the upper substrate holding mechanism 5 and the upper face 11 of the lower spin base 8 is a minute gap (for example, about 1.5 mm) which is narrower than the thickness (for example, about 2 mm) of a first chemical film (chemical film) 51 formed on the upper face 11.

In a state where the upper substrate holding mechanism 5 is disposed at the proximal position, the wafer W is transferred between the lower substrate holding mechanism 4 and the upper substrate holding mechanism 5. In a state where the upper spin base 25 is disposed at a transfer position (the position shown in FIG. 4A and the like to be described later), the wafer W is transferred between the upper substrate holding mechanism 5 and a transfer arm AR. The transfer position of the upper substrate holding mechanism 5 is set to be a height position where the transfer arm AR can come in between the upper spin base 25 of the upper substrate holding mechanism 5 and the lower spin base 8 of the lower substrate holding mechanism 4 and pass and receive the wafer W. In the preferred embodiment, the transfer position is set on the upper side of the distant position to be the height position where a gap between the lower face 26 of the upper spin base 25 at the transfer position and the upper face 11 of the lower spin base 8 is 15 to 20 mm. The transfer position and the distant position are preferably set to be as close to each other as possible. In this case, required time for moving the upper substrate holding mechanism 5 between the distant position and the transfer position can be shortened.

The upper elevation driving mechanism 29 moves the upper spin base 25 in the vertical direction together with the wafer W. Therefore, in a state where the wafer W is held by the upper substrate holding mechanism 5, and even in a case where the upper substrate holding mechanism 5 is placed at any of the proximal position, the distant position, and the transfer position, the center of the wafer W is placed on the central axis of the upper rotational shaft 24.

An upper rotation driving mechanism 30 including a drive source of a motor and the like is coupled to the upper rotational shaft 24. By inputting driving force from the upper rotation driving mechanism 30 to the upper rotational shaft 24, the upper spin base 25 is rotated. Thereby, the wafer W is rotated about the vertical rotation axis passing through the center of the wafer W (central axis of the upper rotational shaft 24).

The cup 6 includes cylindrical outer and inner walls 33 and 34 extending in the vertical direction, and an annular bottom portion 35 that couples lower ends of the walls between the outer wall 33 and the inner wall 34. The outer wall 33 surrounds the lower spin base 8, and an upper portion thereof is tapered toward the upper side. A waste fluid pipe 37 that guides the processing liquid stored in the bottom portion 35 to a waste fluid tank (not shown) is connected to the bottom portion 35. The processing liquid scattering from the peripheral edge of the lower spin base 8 is caught by the outer wall 33, then guided to the bottom portion 35, and disposed. Thereby, the processing liquid is prevented from scattering over a periphery of the cup 6.

Figure 2:
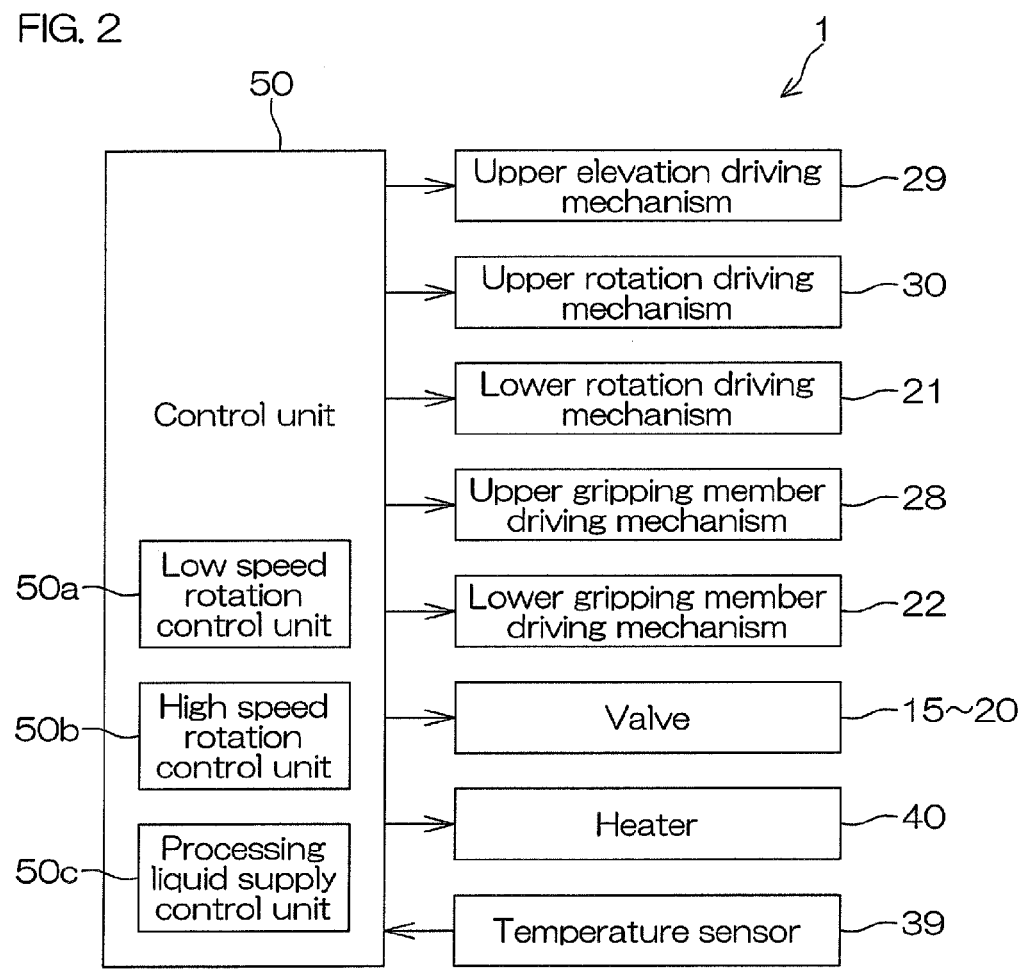
FIG. 2 is a block diagram for illustrating an electric arrangement of the substrate processing apparatus shown in FIG. 1.

FIG. 2 is a block diagram for illustrating an electric arrangement of the substrate processing apparatus 1.

The substrate processing apparatus 1 includes a control unit 50 including a microcomputer. The control unit 50 controls operations of the upper elevation driving mechanism 29, the upper rotation driving mechanism 30, the lower rotation driving mechanism 21, the upper gripping member driving mechanism 28, the lower gripping member driving mechanism 22, and the like. The control unit 50 controls open/close operations of the first chemical bottom valve 15, the second chemical bottom valve 16, the third chemical bottom valve 17, the rinse liquid bottom valve 18, the dry gas bottom valve 19, and the organic solvent bottom valve 20.

The control unit 50 is operated in accordance with computer programs to function as a plurality of functional processing units. The functional processing units include a low speed rotation control unit 50a, a high speed rotation control unit 50b, and a processing liquid supply control unit 50c. The low speed rotation control unit 50a controls the lower rotation driving mechanism 21 to rotate the lower spin base 8 at a low rotational speed with which the processing liquid can be held between the upper face 11 of the lower spin base 8 and the lower face of the wafer W in some processing examples. The high speed rotation control unit 50b controls the lower rotation driving mechanism 21 to rotate the lower spin base 8 at a high rotational speed with which the processing liquid can be shaken off the upper face 11 of the lower spin base 8 in some processing examples. The processing liquid supply control unit 50c controls supply of the processing liquid to the wafer W, and stops supply of the processing liquid to the upper face 11 of the lower spin base 8 when the wafer W is brought into contact with the processing liquid in some processing examples.

A detection output from the temperature sensor 39 is input to the control unit 50. Based on the detection output from the temperature sensor 39, the control unit 50 controls powering of the heater 40 and an electric current to be supplied to the heater 40. By powering the heater 40 by the control unit 50, the heater 40 generates heat. By controlling the electric current to be supplied to the heater 40 by the control unit 50, the upper face 11 of the lower spin base 8 can be heated by the heater 40 and a temperature of the upper face 11 can be increased to a predetermined temperature.

Figure 4A:
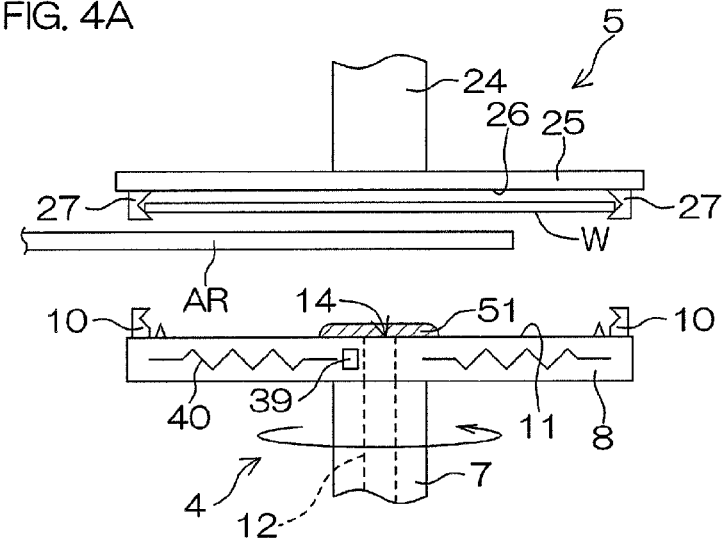
FIGS. 4A-4C are schematic views for illustrating the first processing example to be performed in the substrate processing apparatus shown in FIG. 1 (No. 1).
Figure 4B:
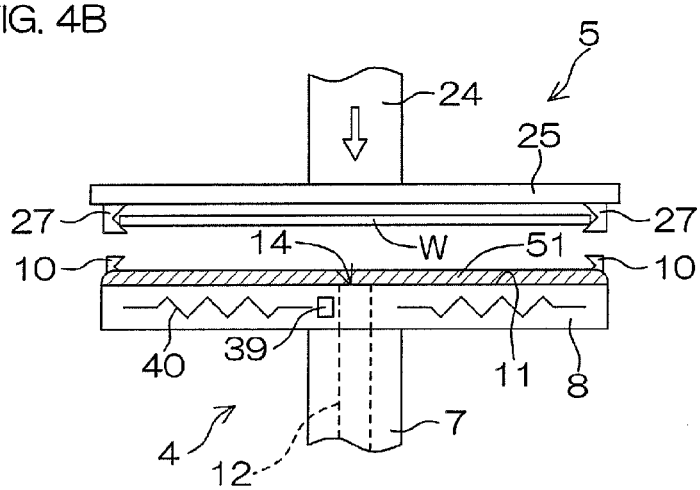
Figure 4C:
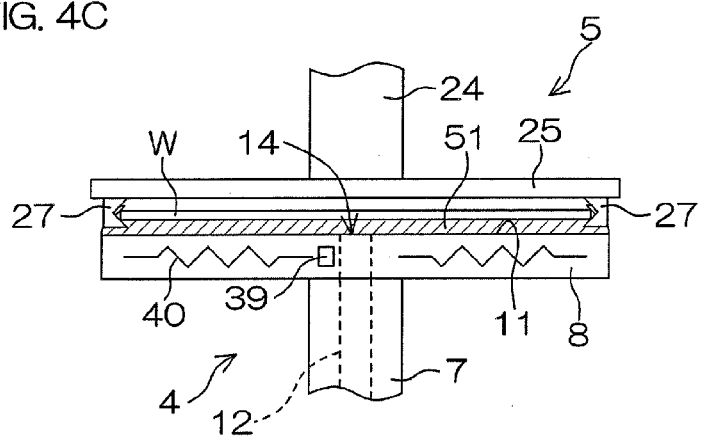

FIG. 3 is a flowchart for illustrating a first processing example to be performed in the substrate processing apparatus 1. FIGS. 4A to 4O are schematic views for illustrating the first processing example to be performed in the substrate processing apparatus 1. The first processing example is an example of processing in which one type of chemical and a rinse liquid are used. A case where the first chemical is used as the chemical will be described as an example. Hereinafter, the first processing example will be described with reference to FIGS. 1 to 5.

As shown in FIG. 4A, for the processing, an unprocessed wafer W is carried into the processing chamber 3 by the transfer arm AR (Step S1 of FIG. 3). At the time of carrying the wafer W in, the upper substrate holding mechanism 5 is disposed at the transfer position. The transfer arm AR transfers the wafer W to the upper substrate holding mechanism 5 in a state where a face to be processed (principal face) of the wafer is directed downward. At the time of transferring the wafer W, the upper gripping member driving mechanism 28 of the upper substrate holding mechanism 5 is driven, the upper gripping members 27 are moved from the release position to the grip position, and the wafer W is held by the upper substrate holding mechanism 5. Thereby, the transfer of the wafer W from the transfer arm AR to the upper substrate holding mechanism 5 is achieved.

As shown in FIG. 4A, in parallel with the carry-in of the wafer W, the control unit 50 opens the first chemical bottom valve 15. Thereby, discharge of the first chemical from the lower discharge port 14 is started. A discharge flow rate of the first chemical from the lower discharge port 14 at this time is, for example, about 0.1 to 1 (liter/min).

The control unit 50 controls the lower rotation driving mechanism 21 to rotate the lower spin base 8 about the central axis of the lower rotational shaft 7 at predetermined first chemical paddle rotational speed (for example, 10 to 100 rpm).

By the discharge of the first chemical from the lower discharge port 14, the substantially circular first chemical film 51 is formed on the upper face 11 of the lower spin base 8 as shown in FIG. 4A. The first chemical discharged from the lower discharge port 14 is pushed by the following first chemical and spreads outward on the upper face 11 of the lower spin base 8. However, since the first chemical paddle rotational speed is relatively low, centrifugal force acting on the first chemical on the upper face 11 is small. Thus, a flow rate of the first chemical discharged from the peripheral edge of the lower spin base 8 is small, and a large volume of the first chemical remains on the upper face 11. Therefore, as shown in FIG. 4B, the first chemical film (processing liquid film) 51 of predetermined thickness (for example, about 2 mm) covering the entire upper face 11 of the lower spin base 8 is formed. Since the first chemical is supplied to the upper face 11 from the lower discharge port 14 defined on the substantial center of the upper face 11, the first chemical film 51 can be promptly formed on the entire upper face 11 without liquid splash.

Figure 5:
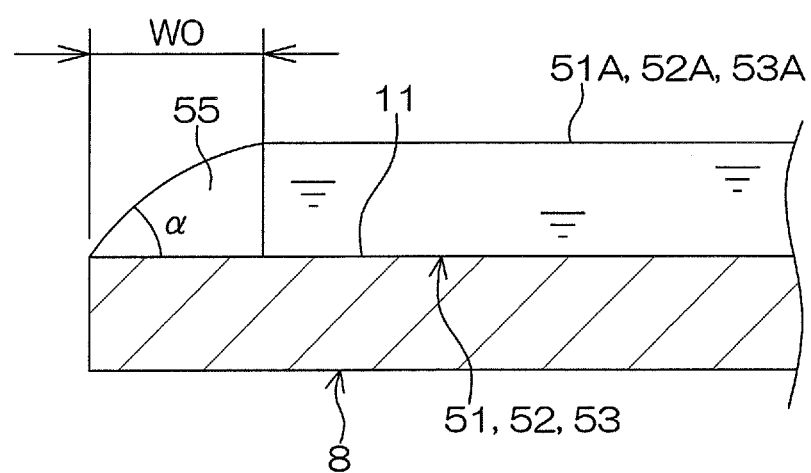
FIG. 5 is a view showing a processing liquid film formed on an upper face of a wafer.

As shown in FIG. 5, the first chemical film 51 has an upper face 51A defining a horizontal flat face except a curved portion 55 formed on a peripheral edge thereof (in a region of width WO from a peripheral end face). The "flat face" herein indicates a substantially flat face with which a difference in processing start time is not caused between a center portion and a peripheral edge of the lower face of the wafer W when the lower face of the wafer W is brought into contact with the film 51. In addition, the first chemical paddle rotational speed is a speed with which the entire upper face 11 of the lower spin base 8 can be covered by the first chemical film 51.

When preliminarily fixed liquid film formation time elapses after the first chemical bottom valve 15 is opened, the control unit 50 closes the first chemical bottom valve 15 and controls the lower rotation driving mechanism 21 to stop the rotation of the lower spin base 8. The liquid film formation time is set to provide a sufficient period of time in which the first chemical film 51 to cover the entire upper face 11 of the lower spin base 8 is formed after the first chemical bottom valve 15 is opened.

As shown in FIG. 4B, the control unit 50 controls the upper elevation driving mechanism 29 to lower the upper substrate holding mechanism 5 that holds the wafer W toward the proximal position. Thereby, the lower face of the wafer W and the upper face 11 of the lower spin base 8 come close to each other. At this time, the control unit 50 controls the relative rotation positions of the upper spin base 25 and the lower spin base 8 so that any of the upper gripping members 27 does not face any of the lower gripping members 10.

As described above, in a state where the upper substrate holding mechanism 5 is disposed at the proximal position, the gap between the lower face of the wafer W and the upper face 11 of the lower spin base 8 is set to be narrower than the thickness of the first chemical film 51. Therefore, by lowering the upper substrate holding mechanism 5 to the proximal position, the lower face of the wafer W can be brought into contact with the upper face 51A (refer to FIG. 5) of the first chemical film 51 formed on the upper face 11 as shown in FIG. 4C.

The first chemical film 51 is coaxial with the wafer W and has a slightly larger diameter than that of the wafer W. Further, the wafer W is held in a horizontal posture, and thus the entire lower face of the wafer W is brought into contact with the upper face 51A of the first chemical film 51 at the same time. That is, the entire lower face of the wafer W is brought into contact with the first chemical at the same time. In this state, the first chemical fills the space between the lower face of the wafer W and the upper face 11, and after that, a state where the first chemical is in contact with the lower face of the wafer W is maintained. Thereby, processing by the first chemical progresses on the lower face of the wafer W (S2: chemical processing).

In addition, a timing at which lowering of the upper substrate holding mechanism 5 is started is preferably set to be a timing at which the lower face of the wafer W is brought into contact with the upper face 51A of the first chemical film 51 immediately after completing the formation of the first chemical film 51 that covers the entire upper face 11 (for example, within five seconds after completing the formation). When the first chemical film 51 is exposed to the atmosphere in the processing chamber 3 for a long time after the formation thereof, there is a fear that the surface of the first chemical film 51 is oxidized by the air contained in the atmosphere in the processing chamber 3. By setting the timing at which the lowering of the upper substrate holding mechanism 5 is started to be such a timing, oxidation on the surface of the first chemical film 51 can be prevented, and deterioration of the first chemical contained in the first chemical film 51 can be prevented.

When the upper substrate holding mechanism 5 reaches the proximal position, the wafer W is transferred from the upper substrate holding mechanism 5 to the lower substrate holding mechanism 4. In a state where the upper substrate holding mechanism 5 is disposed at the proximal position, height of the upper gripping members 27 is substantially equal to height of the lower gripping members 10. Therefore, the lower gripping members 10 are placed on the side of the peripheral edge of the wafer W.

Specifically, the lower gripping member driving mechanism 22 is driven and the lower gripping members 10 are moved from the release position to the grip position. The upper gripping member driving mechanism 28 is driven and the upper gripping members 27 are moved from the grip position to the release position. Thereby, the wafer W is disengaged from the upper substrate holding mechanism 5 and the wafer W is held by the lower substrate holding mechanism 4. Thereby, the transfer of the wafer W from the upper substrate holding mechanism 5 to the lower substrate holding mechanism 4 is achieved. In addition, the transfer of the wafer W between the upper substrate holding mechanism 5 and the lower substrate holding mechanism 4 is performed while maintaining the state where the first chemical is in contact with the lower face of the wafer W. As described above, while preventing a tremor or a slight motion of the wafer W due to a fluid flow at the time of fluid contact and preventing generation of an air gap in the peripheral edge, the wafer W can be reliably transferred.

Figure 4D:
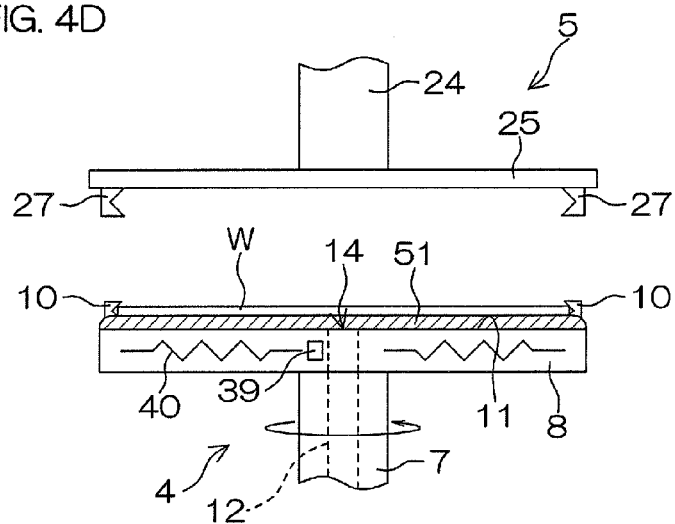
FIGS. 4D-4F are schematic views for illustrating the first processing example to be performed in the substrate processing apparatus shown in FIG. 1 (No. 2).

Next, as shown in FIG. 4D, the control unit 50 controls the upper elevation driving mechanism 29 to raise the upper substrate holding mechanism 5 that does not hold the wafer W from the proximal position to the distant position.

As shown in FIG. 4D, the control unit 50 controls the lower rotation driving mechanism 21 to rotate the lower spin base 8 about the central axis of the lower rotational shaft at predetermined low rotational speed (for example, predetermined rotational speed of 100 rpm or lower) together with the wafer W (function as the low speed rotation control unit 50a). Thereby, the first chemical sandwiched between the upper face 11 and the lower face of the wafer W can be moved and agitated, so that in-plane processing unevenness on the lower face of the wafer W can be prevented. With such low rotational speed, even when the wafer W is rotated, an air gap is hardly generated in the first chemical (first chemical film 51) between the lower face of the wafer W and the upper face 11. In addition, the first chemical may be supplied to the space between the lower face of the wafer W and the upper face 11 at this time.

Figure 4E:
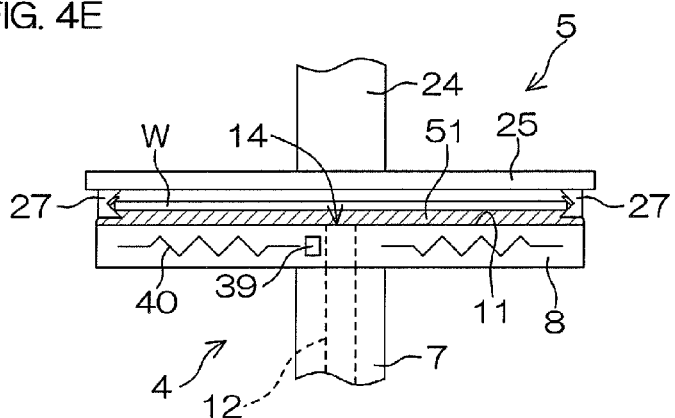

When preliminarily fixed first chemical processing time elapses after the lower substrate holding mechanism 4 receives the wafer W, the lower rotation driving mechanism 21 is controlled and the rotation of the lower spin base 8 is stopped. The wafer W is transferred from the lower substrate holding mechanism 4 to the upper substrate holding mechanism 5. Before the wafer W is transferred from the lower substrate holding mechanism 4 to the upper substrate holding mechanism 5, the control unit 50 controls the upper elevation driving mechanism 29 to lower the upper substrate holding mechanism 5 from the distant position to the proximal position as shown in FIG. 4E. When the upper substrate holding mechanism 5 reaches the proximal position, the wafer W is transferred from the lower substrate holding mechanism 4 to the upper substrate holding mechanism 5. At the proximal position, the upper gripping members 27 are placed on the side of the peripheral edge of the wafer W.

Specifically, the upper gripping member driving mechanism 28 is driven and the upper gripping members 27 are moved from the release position to the grip position. The lower gripping member driving mechanism 22 is driven and the lower gripping members 10 are moved from the grip position to the release position. Thereby, the wafer W is disengaged from the lower substrate holding mechanism 4 and the wafer W is held by the upper substrate holding mechanism 5. As described above, the transfer of the wafer W from the lower substrate holding mechanism 4 to the upper substrate holding mechanism 5 is achieved.

Figure 4F:
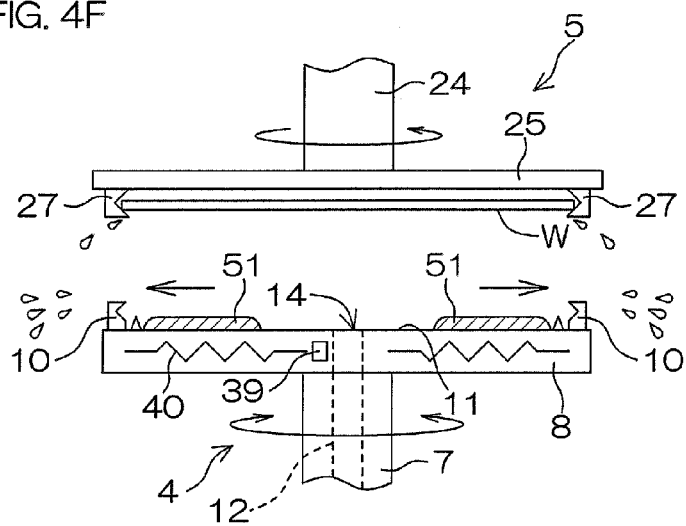

Next, as shown in FIG. 4F, the control unit 50 controls the upper elevation driving mechanism 29 to raise the upper substrate holding mechanism 5 that already receives the wafer W to the distant position.

As shown in FIG. 4F, the control unit 50 controls the lower rotation driving mechanism 21 to rotate the lower spin base 8 about the central axis of the lower rotational shaft 7 at high rotational speed (for example, 1,000 rpm or higher) (function as the high speed rotation control unit 50b). The high rotational speed is a speed with which the first chemical can be shaken off the upper face 11 of the lower spin base 8. By the high speed rotation of the lower spin base 8, the first chemical is shaken off and removed from the upper face 11 of the lower spin base 8.

As shown in FIG. 4F, the control unit 50 controls the upper rotation driving mechanism 30 to rotate the upper spin base 25 disposed at the distant position about the central axis of the upper rotational shaft 24 at a middle rotational speed (for example, about 500 rpm) together with the wafer W. The middle rotational speed is a speed with which the first chemical is not completely shaken off the lower face of the wafer W but the first chemical can thinly remain on the lower face. Thereby, the first chemical can be prevented from being adhered or fixed as a residual chemical. In addition, in a case where the first chemical is not a type of chemical that exerts a harmful influence as a residual chemical, the upper spin base 25 may be rotated at a high speed (for example, 1,000 rpm or higher) and the first chemical may be completely shaken off the lower face of the wafer W. Therefore, at the time of starting rinse processing (Step S3 of FIG. 3) to be executed subsequent to the first chemical processing, the first chemical is not attached to the lower face of the wafer W. Thus, the first chemical can be prevented from mixing into the rinse liquid. As a result, rinse processing efficiency can be enhanced. Thereby, rinse processing time can also be shortened.

Figure 4G:
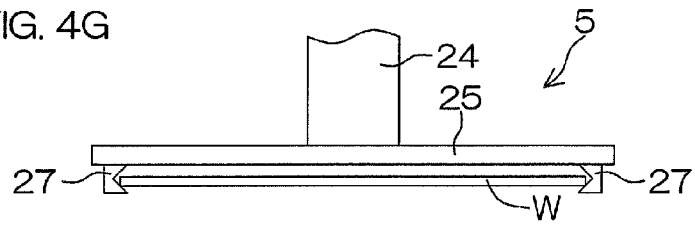
FIGS. 4G-4I are schematic views for illustrating the first processing example to be performed in the substrate processing apparatus shown in FIG. 1 (No. 3).

By the high speed rotation of the lower spin base 8, the first chemical of the upper face 11 of the lower spin base 8 is shaken off and removed from the upper face 11 by the rotation of the lower spin base 8 as shown in FIG. 4G. Thereby, the first chemical can be prevented from remaining on the upper face 11. Particularly, since the upper face 11 is formed to be an entirely flat face, the first chemical does not easily remain at the time of shaking the first chemical off. Therefore, in the rinse processing to be executed subsequent to the first chemical processing, the upper face 11 itself is also efficiently rinsed.

Next, the rinse processing (Step S3 of FIG. 3) is executed.

Figure 4H:
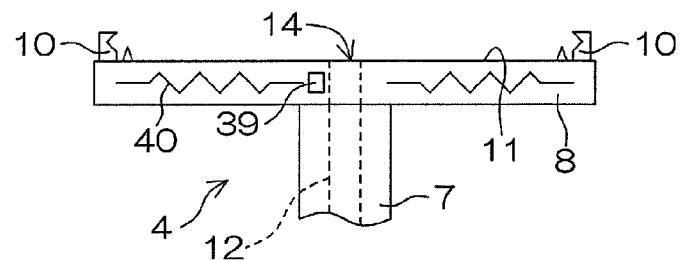

As shown in FIG. 4H, the control unit 50 opens the rinse liquid bottom valve 18. Thereby, discharge of the rinse liquid from the lower discharge port 14 is started. A discharge flow rate of the rinse liquid from the lower discharge port 14 at this time is, for example, about 0.1 to 1 (liter/min).

The control unit 50 controls the lower rotation driving mechanism 21 to rotate the lower spin base 8 about the central axis of the lower rotational shaft 7 at predetermined rinse liquid paddle rotational speed (for example, 10 to 100 rpm).

Figure 4I:
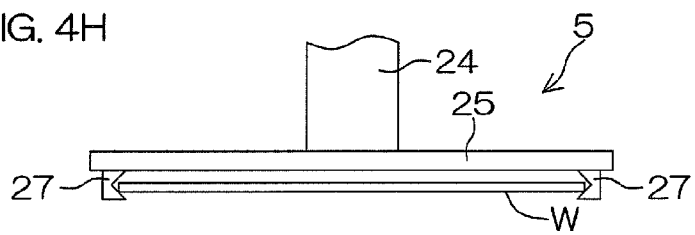

By the discharge of the rinse liquid from the lower discharge port 14, a substantially circular rinse liquid film 52 is formed on the upper face 11 of the lower spin base 8 as shown in FIG. 4H. The rinse liquid discharged from the lower discharge port 14 is pushed by the following rinse liquid and spreads outward on the upper face 11 of the lower spin base 8. However, since the rinse liquid paddle rotational speed is relatively low, centrifugal force acting on the rinse liquid on the upper face 11 is small. Thus, a flow rate of the rinse liquid discharged from the peripheral edge of the lower spin base 8 is small, and a large volume of the rinse liquid remains on the upper face 11. Therefore, as shown in FIG. 4I, the rinse liquid film (processing liquid film) 52 of predetermined thickness (for example, about 2 mm) covering the entire upper face 11 of the lower spin base 8 is formed. Since the rinse liquid is supplied to the upper face 11 from the lower discharge port 14 defined on the substantial center of the upper face 11, the rinse liquid film 52 can be promptly formed on the entire upper face 11 without liquid splash.

As shown in FIG. 5, the rinse liquid film 52 has an upper face 52A defining a horizontal flat face except a curved portion 55 formed on a peripheral edge thereof (in a region of width WO from the peripheral edge). The "flat face" herein indicates a substantially flat face with which a difference in the processing start time is not caused between the center portion and the peripheral edge of the lower face of the wafer W when the lower face of the wafer W is brought into contact with the film 52. In addition, the rinse liquid paddle rotational speed is a speed with which the entire upper face 11 of the lower spin base 8 can be covered by the rinse liquid film 52.

When preliminarily fixed liquid film formation time elapses after the rinse liquid bottom valve 18 is opened, the control unit 50 closes the rinse liquid bottom valve 18 and controls the lower rotation driving mechanism 21 to stop the rotation of the lower spin base 8. The liquid film formation time is set to provide a sufficient period of time in which the rinse liquid film 52 to cover the entire upper face 11 of the lower spin base 8 is formed after the rinse liquid bottom valve 18 is opened.

Figure 4J:
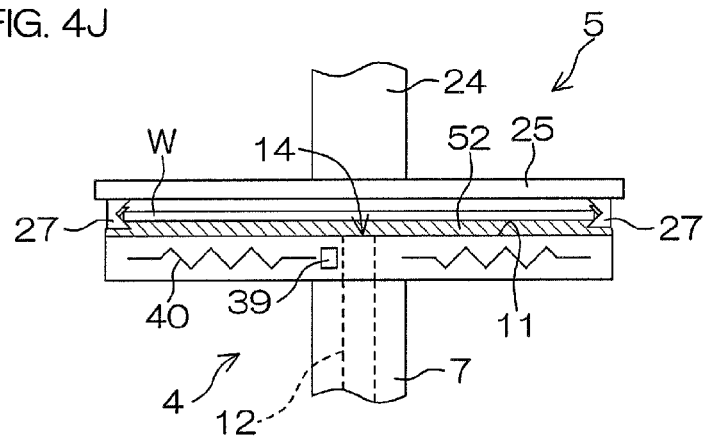
FIGS. 4J-4L are schematic views for illustrating the first processing example to be performed in the substrate processing apparatus shown in FIG. 1 (No. 4).

As shown in FIG. 4I, the control unit 50 controls the upper elevation driving mechanism 29 to lower the upper substrate holding mechanism 5 that holds the wafer W toward the proximal position. Thereby, the lower face of the wafer W and the upper face 11 of the lower spin base 8 come close to each other. In a state where the upper substrate holding mechanism 5 is disposed at the proximal position, the gap between the lower face of the wafer W and the upper face 11 of the lower spin base 8 is set to be narrower than the thickness of the rinse liquid film 52. Therefore, by lowering the upper substrate holding mechanism 5 to the proximal position, the lower face of the wafer W can be brought into contact with the upper face 52A (refer to FIG. 5) of the rinse liquid film 52 formed on the upper face 11 as shown in FIG. 4J.

The rinse liquid film 52 is coaxial with the wafer W and has a slightly larger diameter than that of the wafer W. Further, the wafer W is held in a horizontal posture, and thus the entire lower face of the wafer W is brought into contact with the upper face 52A of the rinse liquid film 52 at the same time. That is, the entire lower face of the wafer W is brought into contact with the rinse liquid at the same time. In this state, the space between the lower face of the wafer W and the upper face 11 is filled with the rinse liquid, and after that, a state where the rinse liquid is in contact with the lower face of the wafer W is maintained and the first chemical attached to the lower face of the wafer W is washed away by the rinse liquid. By the rinse liquid film 52, the upper face 11 itself of the lower spin base 8 is also rinsed.

When the upper substrate holding mechanism 5 reaches the proximal position, the wafer W is transferred from the upper substrate holding mechanism 5 to the lower substrate holding mechanism 4. The transfer of the wafer W between the upper substrate holding mechanism 5 and the lower substrate holding mechanism 4 is performed while maintaining the state where the rinse liquid is in contact with the lower face of the wafer W.

Figure 4K:
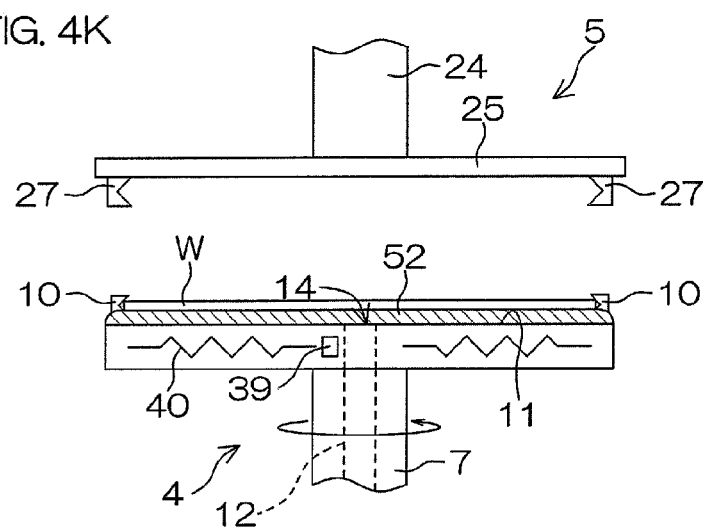

Next, as shown in FIG. 4K, the control unit 50 controls the upper elevation driving mechanism 29 to raise the upper substrate holding mechanism 5 that does not hold the wafer W from the proximal position to the distant position.

As shown in FIG. 4K, the control unit 50 controls the lower rotation driving mechanism 21 to rotate the lower spin base 8 about the central axis of the lower rotational shaft at predetermined low rotational speed (for example, predetermined rotational, speed of 100 rpm or lower) together with the wafer W (function as the low speed rotation control unit 50*a*). Thereby, the rinse liquid can be agitated. With such low rotational speed, even when the wafer W is rotated, an air gap is hardly generated in the rinse liquid (rinse liquid film 52) between the lower face of the wafer W and the upper face 11. In addition, the rinse liquid may be supplied to the space between the lower face of the wafer W and the upper face 11 at this time.

Figure 4L:
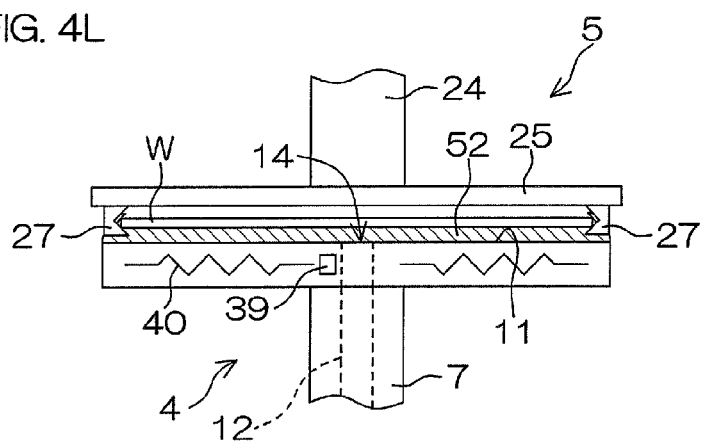

When preliminarily fixed rinse liquid processing time elapses after the lower substrate holding mechanism 4 receives the wafer W, the lower rotation driving mechanism 21 is controlled and the rotation of the lower spin base 8 is stopped. The wafer W is transferred from the lower substrate holding mechanism 4 to the upper substrate holding mechanism 5. Before the wafer W is transferred from the lower substrate holding mechanism 4 to the upper substrate holding mechanism 5, the control unit 50 controls the upper elevation driving mechanism 29 to lower the upper substrate holding mechanism 5 from the distant position to the proximal position as shown in FIG. 4L. When the upper substrate holding mechanism 5 reaches the proximal position, the wafer W is transferred from the lower substrate holding mechanism 4 to the upper substrate holding mechanism 5.

Figure 4M:
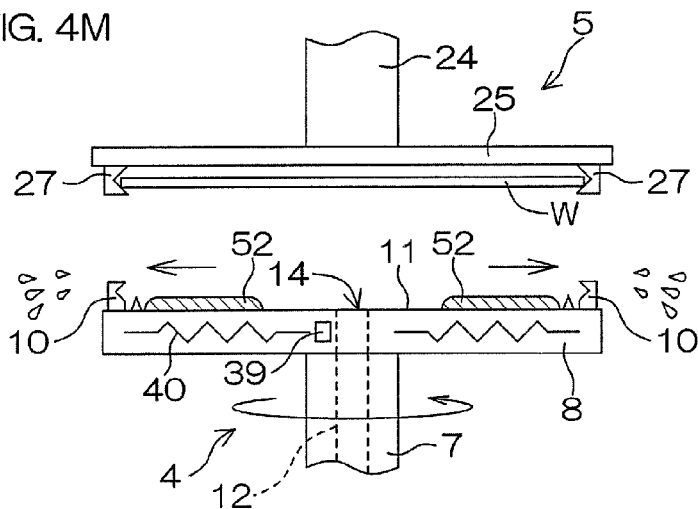
FIGS. 4M-4O are schematic views for illustrating the first processing example to be performed in the substrate processing apparatus shown in FIG. 1 (No. 5).

Next, as shown in FIG. 4M, the control unit 50 controls the upper elevation driving mechanism 29 to raise the upper substrate holding mechanism 5 that already receives the wafer W to the distant position.

Figure 4N:
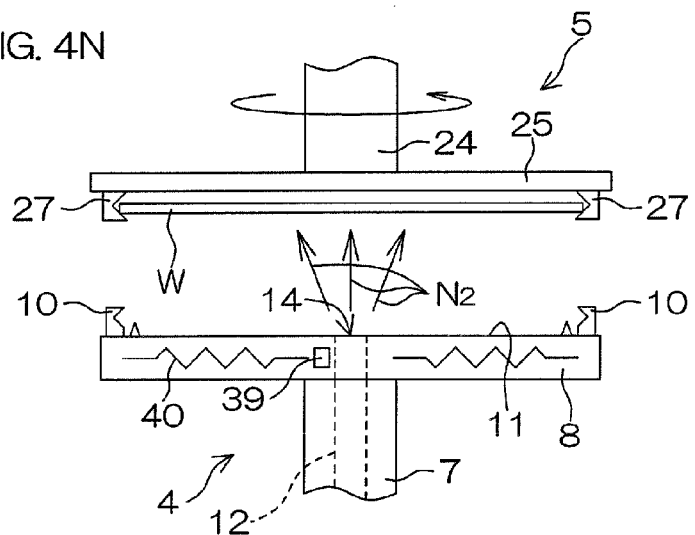
Figure 4O:
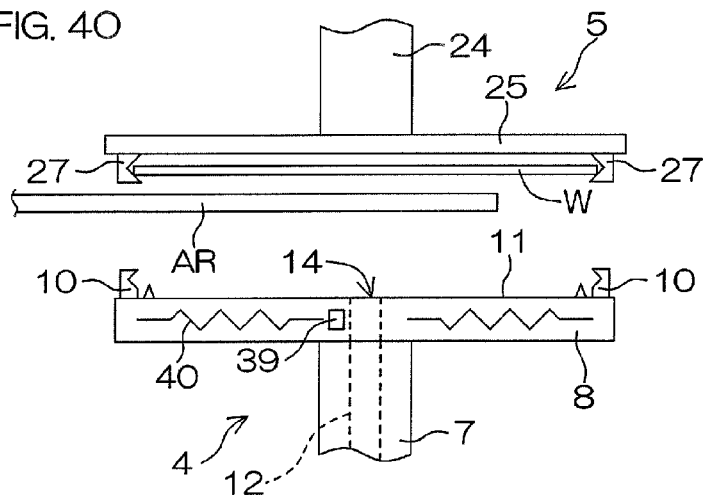

As shown in FIG. 4M, the control unit 50 controls the lower rotation driving mechanism 21 to rotate the lower spin base 8 about the central axis of the lower rotational shaft 7 at high rotational speed (for example, 1,000 rpm or higher) (function as the high speed rotation control unit 50*b*). The high rotational speed is a speed with which the rinse liquid can be shaken off the upper face 11 of the lower spin base 8. By the high speed rotation of the lower spin base 8, the rinse liquid on the upper face 11 of the lower spin base 8 is shaken off by the rotation of the lower spin base 8 and removed from the upper face 11 as shown in FIG. 4N. Thereby, the rinse liquid can be prevented from remaining on the upper face 11. Particularly, since the upper face 11 is formed to be an entirely flat face, the rinse liquid does not easily remain at the time of shaking the rinse liquid off.

Next, drying of the wafer W will be described.

Spin drying by rotating the wafer W at rotational speed with which the rinse liquid attached to the lower face of the wafer W is shaken off is performed (Step S4 of FIG. 3. Refer to FIG. 4N). The control unit 50 controls the upper rotation driving mechanism 30 to rotate the wafer W held by the upper spin base 25 which is disposed at the distant position at predetermined high rotational speed (for example, 1,000 rpm or higher). By the high speed rotation, the rinse liquid on the lower face of the wafer W is shaken off and the rinse liquid is completely removed from the lower face of the wafer W.

As shown in FIG. 4N, in parallel with the spin drying, the control unit 50 opens the dry gas bottom valve 19 to discharge the dry gas upward from the lower discharge port 14. Thereby, the dry gas is blown to the lower face of the wafer W held by the upper substrate holding mechanism 5 which is disposed at the distant position. A discharge flow rate of the dry gas at this time is, for example, 100 to 200 (liter/min). By the blowing of the dry gas, drying of the lower face of the wafer W is facilitated. The dry gas may be a nitrogen gas serving as one example of an inert gas. In this case, instead of the nitrogen gas or in addition to the nitrogen gas, steam of an organic solvent such as IPA and the like can also be blown to the lower face of the wafer W, so that the drying of the lower face of the wafer W can be further facilitated. In addition, at the time of the drying processing, by disposing the upper substrate holding mechanism 5 that holds the wafer W not at the distant position but on the slightly upper side of the proximal position, the upper substrate holding mechanism 5 may be disposed at a position where the upper substrate holding mechanism 5 and the lower substrate holding mechanism 4 do not interfere with each other.

In addition, the high speed rotation of the lower spin base 8 shown in FIG. 4M and the spin drying shown in FIG. 4N are preferably executed in parallel. In this case, the spin drying can be executed immediately after the rinse processing. As a result, the whole processing time can be shortened.

When the spin drying is performed for a predetermined period of time, the control unit 50 controls the upper rotation driving mechanism 30 to stop the rotation of the upper spin base 25 and the wafer W. After that, the control unit 50 controls the upper elevation driving mechanism 29 to move the upper spin base 25 to the transfer position. In a state where the transfer arm AR is capable of holding the wafer W, the control unit 50 controls the upper gripping member driving mechanism 28 of the upper substrate holding mechanism 5 to move the upper gripping members 27 from the grip position to the release position. Thereby, the upper substrate holding mechanism 5 and the wafer W are disengaged from each other, and the transfer of the wafer W from the upper substrate holding mechanism 5 to the transfer arm AR is achieved. After that, the wafer W already subjected to the series of processing is carried out by the transfer arm AR (Step S5 of FIG. 3).

As described above, in the first processing example, by forming the first chemical film 51 on the upper face 11 of the lower spin base 8 opposing the lower face of the wafer W while bringing the lower face of the wafer W and the upper face 11 close to each other to bring the lower face of the wafer W into contact with the first chemical film 51, the entire lower face of the wafer W is brought into contact with the first chemical at the same time. Thereby, over the entire lower face of the wafer W, the chemical processing (first chemical processing) can be started substantially at the same time. Since the discharge of the first chemical from the lower discharge port 14 is stopped before bringing the first chemical into contact with the wafer W, consumption of the first chemical can be suppressed without sacrificing uniformity of the processing in the lower face of the wafer W. Since the chemical processing is started substantially at the same time over the entire lower face of the wafer W, the processing time of the center portion and the peripheral edge of the wafer W can be uniformized.

In the first processing example, by forming the rinse liquid film 52 on the upper face 11 of the lower spin base 8 opposing the lower face of the wafer W while bringing the lower face of the wafer W and the upper face 11 close to each other to bring the lower face of the wafer W into contact with the rinse liquid film 52, the entire lower face of the wafer W is brought into contact with the rinse liquid at the same time. Thereby, over the entire lower face of the wafer W, the rinse processing can be started substantially at the same time. Since the discharge of the rinse liquid from the lower discharge port 14 is stopped before bringing the rinse liquid W into contact with the wafer W, consumption of the rinse liquid can be suppressed. Since the rinse is started substantially at the same time over the entire lower face of the wafer W, the processing time of the center portion and the peripheral edge of the wafer W can be uniformized.

Thereby, in each of the chemical processing (first chemical processing) and the rinse processing, substrate processing with high in-plane uniformity can be realized while reducing running costs.

Figure 6:
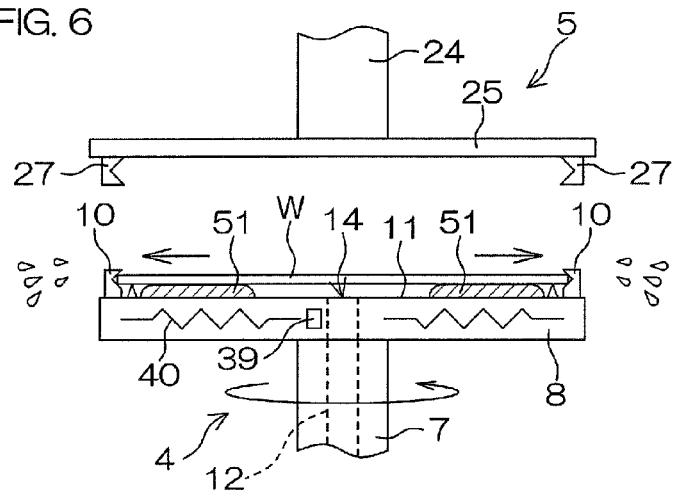
FIG. 6 is a schematic view for illustrating a modified example of the first processing example (No. 1).
Figure 7:
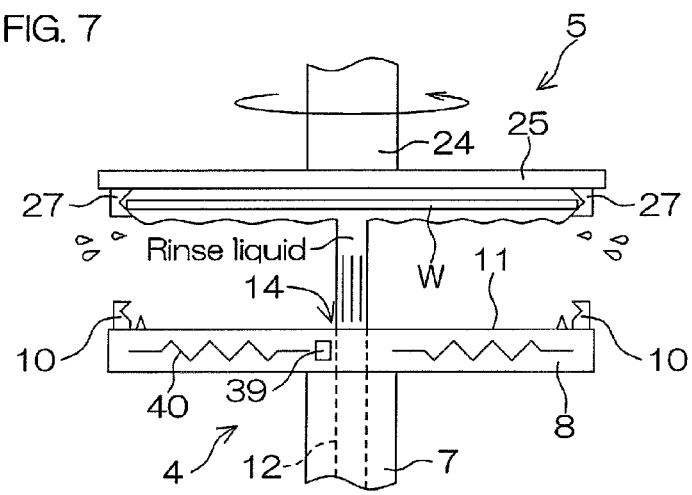
FIG. 7 is a schematic view for illustrating a modified example of the first processing example (No. 2).
Figure 8:
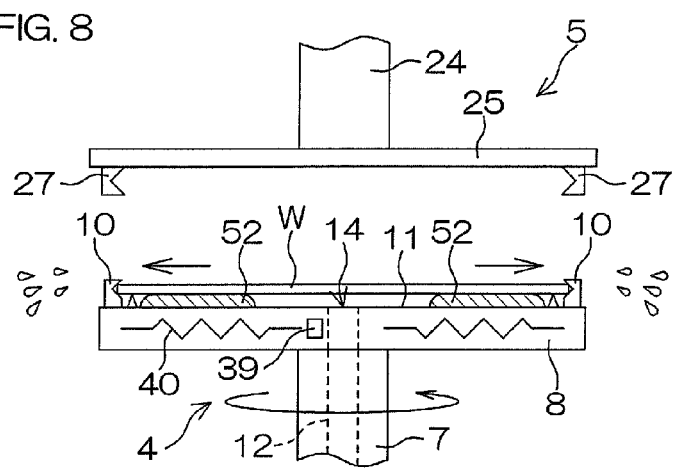
FIG. 8 is a schematic view for illustrating a modified example of the first processing example (No. 3).

FIGS. 6 to 8 are schematic views for illustrating modified examples of the first processing example.

In the modified example shown in FIG. 6, shaking of the first chemical off the lower spin base 8 (corresponding to FIG. 4F) is performed not in a state where the wafer W is held by the upper substrate holding mechanism 5 but in a state where the wafer W is held by the lower substrate holding mechanism 4. Specifically, in a state where the wafer W is held by the lower spin base 8, the lower spin base 8 is rotated about the central axis of the lower rotational shaft 7 at high rotational speed (for example, 1,000 rpm or higher). In association with the rotation of the lower spin base 8, the wafer W is also rotated. Thereby, the first chemical can be not only shaken off the upper face 11 of the lower spin base 8 but also shaken off the lower face of the wafer W.

In a case where the modified example is adopted, after finishing shaking the first chemical off the lower spin base 8, the upper elevation driving mechanism 29 may be controlled and the upper substrate holding mechanism 5 may be lowered from the distant position to the proximal position. After the wafer W is transferred from the lower substrate holding mechanism 4 to the upper substrate holding mechanism 5, the upper substrate holding mechanism 5 that already receives the wafer W may be raised to the distant position.

In this case, by supplying the rinse liquid to the space between the lower face of the wafer W and the upper face 11 without disposing at the distant position while the wafer W is held by the lower substrate holding mechanism 4, the processing can also be shifted to the rinse processing straightaway. In this case, since the rinse processing is performed without performing elevation operations of the wafer W, the processing time can be shortened.

In the modified example shown in FIG. 7, the rinse processing (corresponding to FIGS. 4H, 4I, 4J, and 4K) is performed by supplying the rinse liquid blown upward from the lower discharge port 14 to the center portion of the lower face of the wafer W. The rinse liquid supplied to the lower face of the wafer W flows toward the peripheral edge of the wafer W through the lower face of the wafer W in accordance with the rotation of the wafer W. Therefore, the rinse liquid supplied to the center of the lower face of the wafer W spreads to the entire lower face of the wafer W. Thereby, the first chemical attached to the lower face of the wafer W can be favorably washed away by the rinse liquid.

In the modified example shown in FIG. 8, the shaking of the rinse liquid off the lower spin base 8 (corresponding to FIG. 4M) and the spin drying (corresponding to FIG. 4N) are performed not in a state where the wafer W is held by the upper substrate holding mechanism 5 but in a state where the wafer W is held by the lower substrate holding mechanism 4. Specifically, the control unit 50 controls the lower rotation driving mechanism 21 to rotate the lower spin base 8 about the central axis of the lower rotational shaft 7 at high rotational speed (for example, 1,000 rpm or higher). The wafer W is also rotated in association with the rotation of the lower spin base 8. By the high speed rotation, the rinse liquid is shaken off the upper face 11 of the lower spin base 8 and the rinse liquid on the lower face of the wafer W is shaken off. Thereby, the rinse liquid is completely removed from the lower face of the wafer W. Thereby, the rinse liquid can be shaken off both the upper face 11 of the lower spin base 8 and the lower face of the wafer W at the same time.

In this case, by driving the lower rotation driving mechanism 21, the lower spin base 8 and the wafer W are integrally rotated. The dry gas bottom valve 19 is opened and the dry gas is supplied to a narrow space between the upper face 11 of the lower spin base 8 and the lower face of the wafer W from the lower discharge port 14. By supplying the dry gas, a stable flow of the dry gas is generated in the narrow space between the lower face of the wafer W and the upper face 11. Thus, the wafer W can be efficiently dried. Thereby, drying time can be shortened.

After finishing the first chemical processing, the rinse liquid can then be discharged from the lower discharge port 14 without performing the shaking of the first chemical off the lower spin base 8. In this case, the first chemical filled in the narrow space between the lower face of the wafer W and the upper face 11 can be replaced with the rinse liquid.

In addition, although the first processing example shows the example of the processing of starting to bring the lower face of the wafer W and the upper face 11 close to each other after stopping the supply of the first chemical to the upper face 11, the lower face of the wafer W and the upper face 11 may start to be brought close to each other in synchronization with the stop of the supply of the first chemical to the upper face 11.

A small flow rate of the first chemical may be supplied even after forming the first chemical film 51. In this case, by rotating the upper face 11 of the lower spin base 8, a new solution can be supplied continuously to the first chemical film 51 over the entire upper face 11. Since a small supply flow rate of the first chemical is sufficient in this case, consumption of the first chemical can be suppressed.

Although the first processing example shows the example of the processing of starting to bring the lower face of the wafer W and the upper face 11 close to each other after stopping the supply of the rinse liquid to the upper face 11, the lower face of the wafer W and the upper face 11 may start to be brought close to each other in synchronization with the stop of the supply of the rinse liquid to the upper face 11.

A small flow rate of the rinse liquid may be supplied even after forming the rinse liquid film 52. In this case, by rotating the upper face 11 of the lower spin base 8, a new liquid can be supplied continuously to the rinse liquid film 52 over the entire upper face 11. Since a small supply flow rate of the rinse liquid is sufficient in this case, consumption of the rinse liquid can be suppressed.

Although the supply of the processing liquid (chemical) to the upper face 11 is started in parallel with the carry-in of the wafer W in the first processing example, the supply of the processing liquid (chemical) to the upper face 11 of the lower spin base 8 may be completed before the carry-in of the wafer W. In this case, it is possible to start lowering of the upper substrate holding mechanism 5 to the proximal position immediately after the wafer W is held by the upper substrate holding mechanism 5. Thereby, the whole processing time including transfer operations of the wafer W between the transfer arm AR and the upper substrate holding mechanism 5 can be shortened.

Next, a case where the first chemical processing is performed on the wafer W with a high-temperature first chemical in the first processing example of the substrate processing apparatus 1 will be described.

In the preferred embodiment, all the processing liquids (the first to third chemicals and the rinse liquid) to be supplied to the lower face supply pipe 12 have a room temperature. The upper face 11 of the lower spin base 8 is arranged to be heated by the heater 40. Therefore, a temperature of the room temperature first chemical discharged from the lower discharge port 14 can be increased by the upper face 11.

The control unit 50 controls the electric current to be supplied to the heater 40 based on the detection output of the temperature sensor 39 disposed in the vicinity of the upper face 11 to increase the temperature of the upper face 11 of the lower spin base 8 to a predetermined set temperature (the temperature higher than the room temperature). When the room-temperature first chemical is discharged from the lower discharge port 14 in a state where the upper face 11 of the lower spin base 8 is maintained at the predetermined set temperature, a large volume of the first chemical discharged from the lower discharge port 14 remains on the upper face 11 and forms the first chemical film 51. By heat exchange with the upper face 11 of the lower spin base 8, the first chemical contained in the film 51 is also heated and the temperature is increased to the set temperature of the upper face 11 or a temperature close to the set temperature. By bringing the heated first chemical into contact with the lower face of the wafer W, the first chemical processing is performed on the lower face of the wafer W. At this time, the temperature of the upper face 11 is uniform throughout. Thus, the temperature of the first chemical film 51 is also uniform throughout on the upper face 11. Therefore, in-plane uniformity of the processing by the first chemical can be furthermore improved. Since the wafer W is processed by using the high-temperature processing liquid, the processing time can be shortened.

Next, in a case where the wafer W is rinsed with a high-temperature rinse liquid in the first processing example of the substrate processing apparatus, the control unit 50 controls the electric current to be supplied to the heater 40 based on the detection output of the temperature sensor 39 to increase the temperature of the upper face 11 of the lower spin base 8 to a predetermined set temperature (the temperature higher than the room temperature). When the room-temperature rinse liquid is discharged from the lower discharge port 14 in a state where the upper face 11 of the lower spin base 8 is maintained at the predetermined set temperature, a large volume of the rinse liquid discharged from the lower discharge port 14 remains on the upper face 11 and forms the rinse liquid film 52. By heat exchange with the upper face 11 of the lower spin base 8, the rinse liquid contained in the film 52 is also heated and the temperature is increased to the set temperature of the upper face 11 or a temperature close to the set temperature. By bringing the heated rinse liquid into contact with the lower face of the wafer W, the lower face of the wafer W is rinsed.

FIG. 9 is a flowchart for illustrating a second processing example to be performed in the substrate processing apparatus 1. With reference to FIGS. 1, 2, 4A, and 9, the second processing example will be described.

The second processing example is different from the first processing example shown in FIG. 3 and the like in that organic solvent replacement processing of Step S14 is provided.

For processing of the second processing example, by the transfer arm AR (refer to FIG. 4A and the like), the unprocessed wafer W is carried into the processing chamber 3 (Step S11 of FIG. 9). Next, by bringing the first chemical into contact with the lower face of the wafer W, the first chemical processing is performed on the lower face of the wafer W (Step S12 of FIG. 9). After that, by bringing the rinse liquid into contact with the lower face of the wafer W, the first chemical is washed away from the lower face of the wafer W (S13: rinse processing). In the second processing example, next, the rinse liquid attached to the lower face of the wafer W is replaced with an organic solvent having a smaller contact angle than that of water (in other words, having small surface tension) (Step S14 of FIG. 9). IPA (isopropyl alcohol) or the like can be shown as an example of the organic solvent.

After the replacement with the organic solvent, next, the spin drying by rotating the wafer W at rotational speed with which the organic solvent attached to the lower face of the wafer W is shaken off is performed (Step S15 of FIG. 9). After that, the wafer W already subjected to the series of processing is carried out by the transfer arm AR (Step S16 of FIG. 9). Processing of Steps S11, S12, S13, S15, S16 are the same processing as Steps S1, S2, S3, S4, S5 of FIG. 3, respectively.

FIGS. 10A to 10E are schematic views for illustrating the second processing example. Hereinafter, with reference to FIGS. 1, 2, 5, and 10A to 10E, a flow of the organic solvent replacement processing of Step S14 will be described.

Figure 10A:
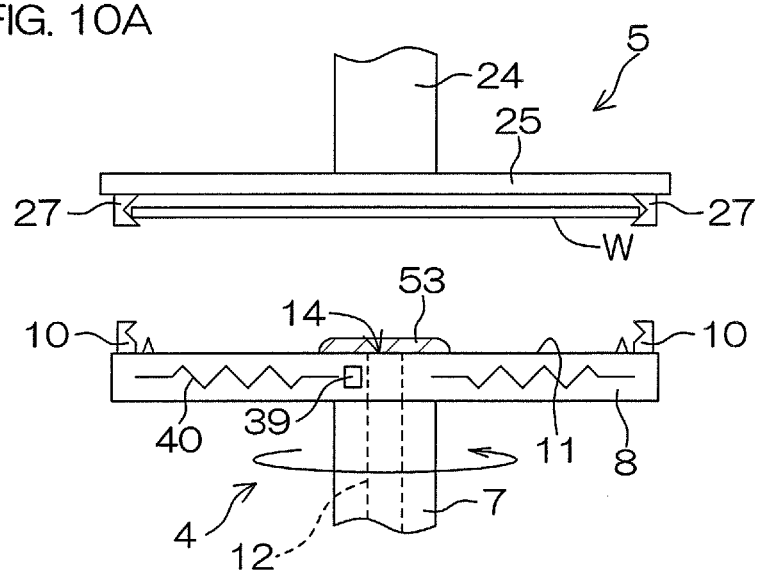
FIGS. 10A-10B are schematic views for illustrating the second processing example (No. 1).

As shown in FIG. 10A, the control unit 50 opens the organic solvent bottom valve 20. Thereby, discharge of the organic solvent from the lower discharge port 14 is started. A discharge flow rate of the organic solvent from the lower discharge port 14 at this time is, for example, about 0.1 to 1 (liter/min).

The control unit 50 controls the lower rotation driving mechanism 21 to rotate the lower spin base 8 about the central axis of the lower rotational shaft 7 at predetermined organic solvent paddle rotational speed (for example, 10 to 100 rpm).

Figure 10B:
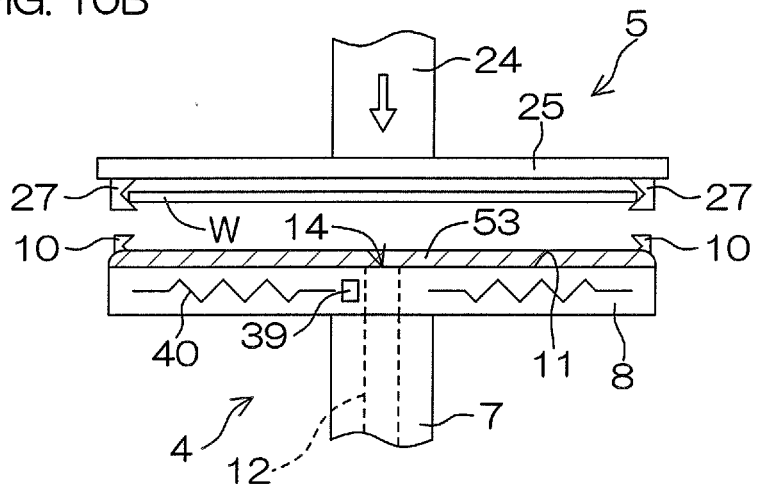

By the discharge of the organic solvent from the lower discharge port 14, a substantially circular organic solvent film 53 is formed on the upper face 11 of the lower spin base 8 as shown in FIG. 10A. The organic solvent discharged from the lower discharge port 14 is pushed by the following organic solvent and spreads outward on the upper face 11 of the lower spin base 8. However, since the organic solvent paddle rotational speed is relatively low, centrifugal force acting on the organic solvent on the upper face 11 is small. Thus, a flow rate of the organic solvent discharged from the peripheral edge of the lower spin base 8 is small, and a large volume of the organic solvent remains on the upper face 11. Therefore, as shown in FIG. 10B, the organic solvent film (processing liquid film) 53 of predetermined thickness (for example, about 2 mm) covering the entire upper face 11 of the lower spin base 8 is formed. Since the organic solvent is supplied to the upper face 11 from the lower discharge port 14 formed on the substantial center of the upper face 11, the organic solvent film 53 can be promptly formed on the upper face 11 without liquid splash.

As shown in FIG. 5, the organic solvent film 53 has an upper face 53A defining as a horizontal flat face except a curved portion 55 formed on a peripheral edge thereof (in a region of width WO from the peripheral edge). The "flat face" herein indicates a substantially flat face with which a difference in the processing start time is not caused between the center portion and the peripheral edge of the lower face of the wafer W when the lower face of the wafer W is brought into contact with the film 53. In addition, the organic solvent paddle rotational speed is a speed with which the entire upper face 11 of the lower spin base 8 can be covered by the organic solvent film 53.

When preliminarily fixed liquid film formation time elapses after the organic solvent bottom valve 20 is opened, the control unit 50 closes the organic solvent bottom valve 20 and controls the lower rotation driving mechanism 21 to stop the rotation of the lower spin base 8. The liquid film formation time is set to provide a sufficient period of time in which the organic solvent film 53 to cover the entire upper face 11 of the lower spin base 8 is formed after the organic solvent bottom valve 20 is opened.

Figure 10C:
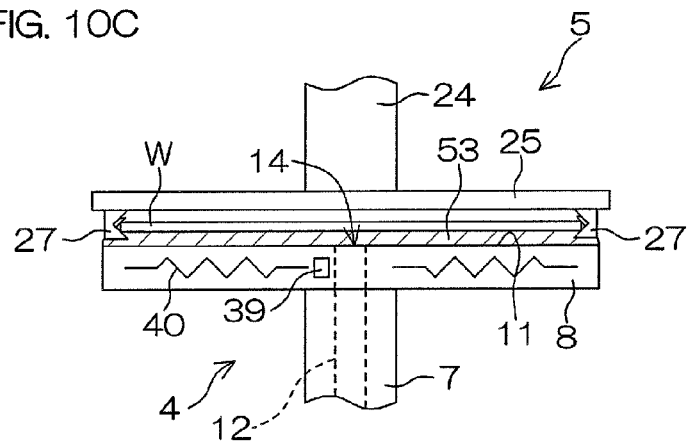
FIGS. 10C-10E are schematic views for illustrating the second processing example (No. 2).

As shown in FIG. 10B, the control unit 50 controls the upper elevation driving mechanism 29 to lower the upper substrate holding mechanism 5 that holds the wafer W toward the proximal position. Thereby, the lower face of the wafer W and the upper face 11 of the lower spin base 8 come close to each other. In a state where the upper substrate holding mechanism 5 is disposed at the proximal position, the gap between the lower face of the wafer W and the upper face 11 is narrower than the thickness of the organic solvent film 53. Thus, by lowering the upper substrate holding mechanism 5 to the proximal position, the lower face of the wafer W can be brought into contact with the upper face 53A (refer to FIG. 5) of the organic solvent film 53 formed on the upper face 11 as shown in FIG. 10C.

The organic solvent film 53 is coaxial with the wafer W and has a slightly larger diameter than that of the wafer W. Further, the wafer W is held in a horizontal posture, and thus the entire lower face of the wafer W is brought into contact with the upper face 53A of the organic solvent film 53 at the same time. That is, the entire lower face of the wafer W is brought into contact with the organic solvent at the same time. In this state, the space between the lower face of the wafer W and the upper face 11 is filled with the organic solvent, and after that, a state where the organic solvent is in contact with the lower face of the wafer W is maintained and the rinse liquid attached to the lower face of the wafer W is replaced with the organic solvent.

When the upper substrate holding mechanism 5 reaches the proximal position, the wafer W is transferred from the upper substrate holding mechanism 5 to the lower substrate holding mechanism 4. The transfer of the wafer W between the upper substrate holding mechanism 5 and the lower substrate holding mechanism 4 is performed while maintaining the state where the lower face of the wafer W is in contact with the organic solvent film 53.

Figure 10D:
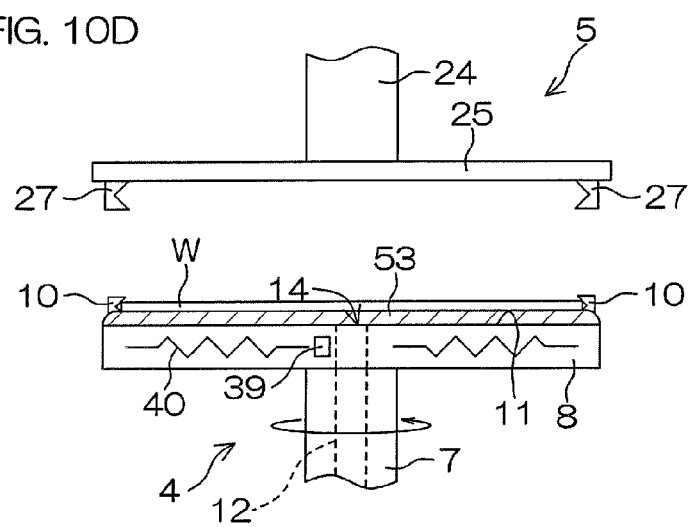

Next, as shown in FIG. 10D, the control unit 50 controls the upper elevation driving mechanism 29 to raise the upper substrate holding mechanism 5 that does not hold the wafer W from the proximal position to the distant position.

As shown in FIG. 10D, the control unit 50 controls the lower rotation driving mechanism 21 to rotate the lower spin base 8 about the central axis of the lower rotational shaft 7 at predetermined low rotational speed (for example, predetermined rotational speed of 100 rpm or lower) together with the wafer W. Thereby, the organic solvent can be agitated. With such low rotational speed, even when the wafer W is rotated, an air gap is hardly generated in the organic solvent (organic solvent film 53) between the lower face of the wafer W and the upper face 11. In addition, the organic solvent may be supplied to the space between the lower face of the wafer W and the upper face 11 at this time.

Figure 10E:
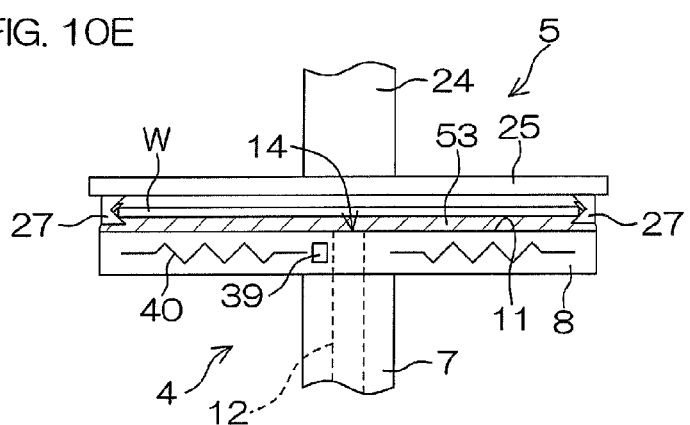

When preliminarily fixed organic solvent processing time elapses after the lower substrate holding mechanism 4 receives the wafer W, the lower rotation driving mechanism 21 is controlled and the rotation of the lower spin base 8 is stopped. The wafer W is transferred from the lower substrate holding mechanism 4 to the upper substrate holding mechanism 5. Before the wafer W is transferred from the lower substrate holding mechanism 4 to the upper substrate holding mechanism 5, the control unit 50 controls the upper elevation driving mechanism 29 to lower the upper substrate holding mechanism 5 from the distant position to the proximal position as shown in FIG. 10E. When the upper substrate holding mechanism 5 reaches the proximal position, the wafer W is transferred from the lower substrate holding mechanism 4 to the upper substrate holding mechanism 5.

The control unit 50 controls the upper elevation driving mechanism 29 to raise the upper substrate holding mechanism 5 that already receives the wafer W to the distant position. After that, the spin drying of Step S14 is performed on the wafer W.

According to the second processing example, the spin drying is performed after replacing the rinse liquid with the organic solvent. Thus, collapse of patterns of the wafer W can be suppressed or prevented.

Figure 11:
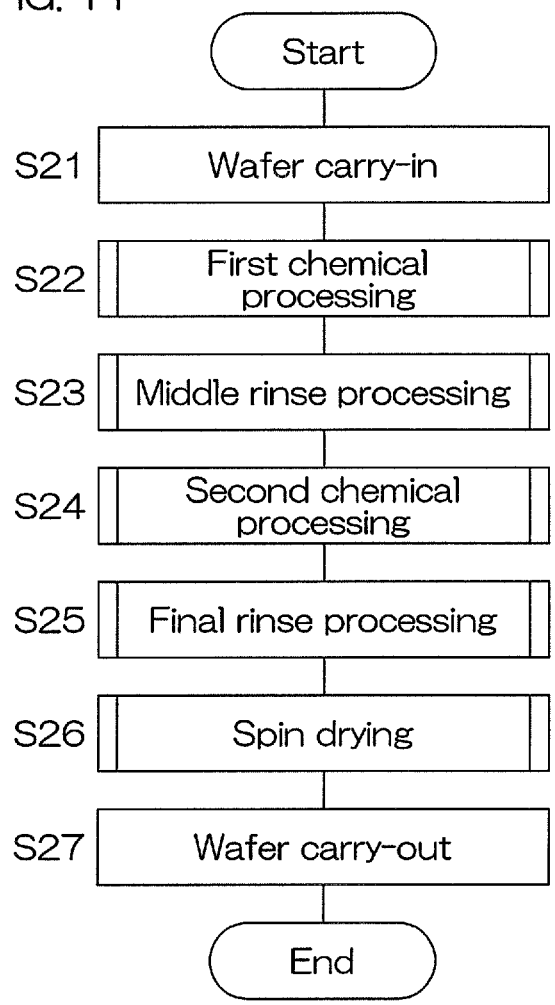
FIG. 11 is a flowchart for illustrating a third processing example to be performed in the substrate processing apparatus shown in FIG. 1.

FIG. 11 is a flowchart for illustrating a third processing example to be performed in the substrate processing apparatus 1. With reference to FIGS. 1, 2, 4A, and 11, the third processing example will be described.

The third processing example is different from the first processing example shown in FIG. 3 and the like in that the wafer W is processed by using two different types of chemicals (for example, the first chemical and the second chemical) and the rinse liquid.

For processing of the third processing example, by the transfer arm AR (refer to FIG. 4A and the like), the unprocessed wafer W is carried into the processing chamber 3 (Step S21 of FIG. 11). Next, by bringing the first chemical into contact with the lower face of the wafer W, the first chemical processing is performed on the lower face of the wafer W (Step S22 of FIG. 11). After that, by bringing the rinse liquid into contact with the lower face of the wafer W, the first chemical is washed away from the lower face of the wafer W (S23: middle rinse processing).

Next, by bringing the second chemical into contact with the lower face of the wafer W, second chemical processing is performed on the lower face of the wafer W (Step S24 of FIG. 11). After that, by bringing the rinse liquid into contact with the lower face of the wafer W, the second chemical is washed away from the lower face of the wafer W (S25: final rinse processing).

Next, the spin drying by rotating the wafer W at rotational speed with which the rinse liquid attached to the lower face of the wafer is shaken off is performed (Step S26 of FIG. 11). After that, the wafer W already subjected to the series of processing is carried out by the transfer arm AR (Step S27 of FIG. 11).

Processing of Steps S21, S22, S25, S26, S27 are the same processing as Steps S1, S2, S3, S4, S5 of FIG. 3, respectively.

The middle rinse processing of Step S23 is the same processing as the rinse processing of Step S3 except in the point that the processing is middle rinse processing to be executed after the first chemical processing of Step S22 and before the second chemical processing of Step S24.

The second chemical processing of Step S24 is different from the first chemical processing of Step S2 of FIG. 3 in that the chemical to be used for processing (to be brought into contact with the lower face of the wafer W) is not the first chemical but the second chemical, and is the same processing as the first chemical processing of Step S2 of FIG. 3 except in that point. In the second chemical processing of Step S24, the control unit 50 selectively opens the second chemical bottom valve 16 to discharge the second chemical from the lower discharge port 14. Thereby, a second chemical film is formed on the upper face 11. By bringing the lower face of the wafer W and the upper face 11 close to each other to bring the lower face of the wafer W into contact with the second chemical film, the entire lower face of the wafer W is brought into contact with the second chemical at the same time. Thereby, the second chemical processing can be started substantially at the same time over the entire lower face of the wafer W. Before bringing the second chemical into contact with the wafer W, discharge of the second chemical from the lower discharge port 14 is stopped. Thus, consumption of the second chemical can be suppressed without sacrificing the uniformity of the processing in the lower face of the wafer W.

As described above, according to the third processing example, the middle rinse processing of Step S23 is executed between the first chemical processing of Step S22 and the second chemical processing of Step S24. At the time of the middle rinse processing, the chemical (first chemical) attached to the upper face 11 is also washed away by the rinse liquid supplied to the upper face 11. Thereby, mixture (contamination) of the first chemical and the second chemical can be reliably prevented.

Figure 12:
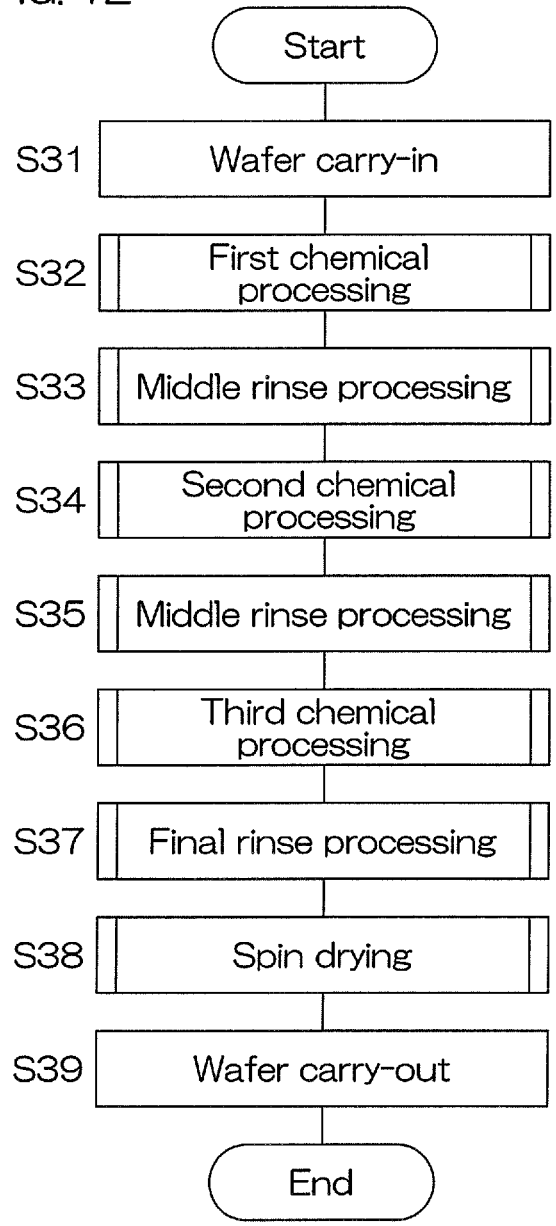
FIG. 12 is a flowchart for illustrating a fourth processing example to be performed in the substrate processing apparatus shown in FIG. 1.

FIG. 12 is a flowchart for illustrating a fourth processing example to be performed in the substrate processing apparatus 1. With reference to FIGS. 1, 2, 4A, and 12, the fourth processing example will be described.

The fourth processing example is different from the second processing example shown in FIG. 11 in that one type of chemical to be used for processing is further added and the wafer W is processed by using three different types of chemicals (for example, the first chemical, the second chemical, and the third chemical) and the rinse liquid.

Upon processing of the fourth processing example, by the transfer arm AR (refer to FIG. 4A and the like), the unprocessed wafer W is carried into the processing chamber 3 (Step S31 of FIG. 12). Next, by bringing the first chemical into contact with the lower face of the wafer W, the first chemical processing is performed on the lower face of the wafer W (Step S32 of FIG. 12). After that, by bringing the rinse liquid into contact with the lower face of the wafer W, the first chemical is washed away from the lower face of the wafer W (S33: middle rinse processing).

Next, by bringing the second chemical into contact with the lower face of the wafer W, the second chemical processing is performed on the lower face of the wafer W (Step S34 of FIG. 12). After that, by bringing the rinse liquid into contact with the lower face of the wafer W, the second chemical is washed away from the lower face of the wafer W (S35: middle rinse processing).

Next, by bringing the third chemical into contact with the lower face of the wafer W, third chemical processing is performed on the lower face of the wafer W (Step S36 of FIG. 12). After that, by bringing the rinse liquid into contact with the lower face of the wafer W, the third chemical is washed away from the lower face of the wafer W (S37: final rinse processing).

Next, the spin drying by rotating the wafer W at rotational speed with which the rinse liquid attached to the lower face of the wafer W is shaken off is performed (Step S38 of FIG. 12). After that, the wafer W already subjected to the series of processing is carried out by the transfer arm AR (Step S39 of FIG. 12).

Processing of Steps S31, S32, S33, S34, S37, S38, S39 are the same processing as Steps S21, S22, S23, S24, S25, S26, S27 of FIG. 11, respectively.

The middle rinse processing of Step S35 is the same processing as the middle rinse processing of Step S33 (the middle rinse processing of Step S23 of FIG. 11), that is, the same processing as the rinse processing of Step S3 of FIG. 3.

The third chemical processing of Step S36 is different from the first chemical processing of Step S2 of FIG. 3 in that the chemical to be used for processing (to be brought into contact with the lower face of the wafer W) is not the first chemical but the third chemical, and is the same processing as the first chemical processing of Step S2 of FIG. 3 except in that point. In the third chemical processing of Step S36, the control unit 50 selectively opens the third chemical bottom valve 17 to discharge the third chemical from the lower discharge port 14. Thereby, a third chemical film is formed on the upper face 11. By bringing the lower face of the wafer W and the upper face 11 close to each other to bring the lower face of the wafer W into contact with the third chemical film, the entire lower face of the wafer W is brought into contact with the third chemical at the same time. Thereby, the third chemical processing can be started substantially at the same time over the entire lower face of the wafer W. Before bringing the third chemical into contact with the wafer W, discharge of the third chemical from the lower discharge port 14 is stopped. Thus, consumption of the third chemical can be suppressed without sacrificing the uniformity of the processing in the lower face of the wafer W.

Figure 13:
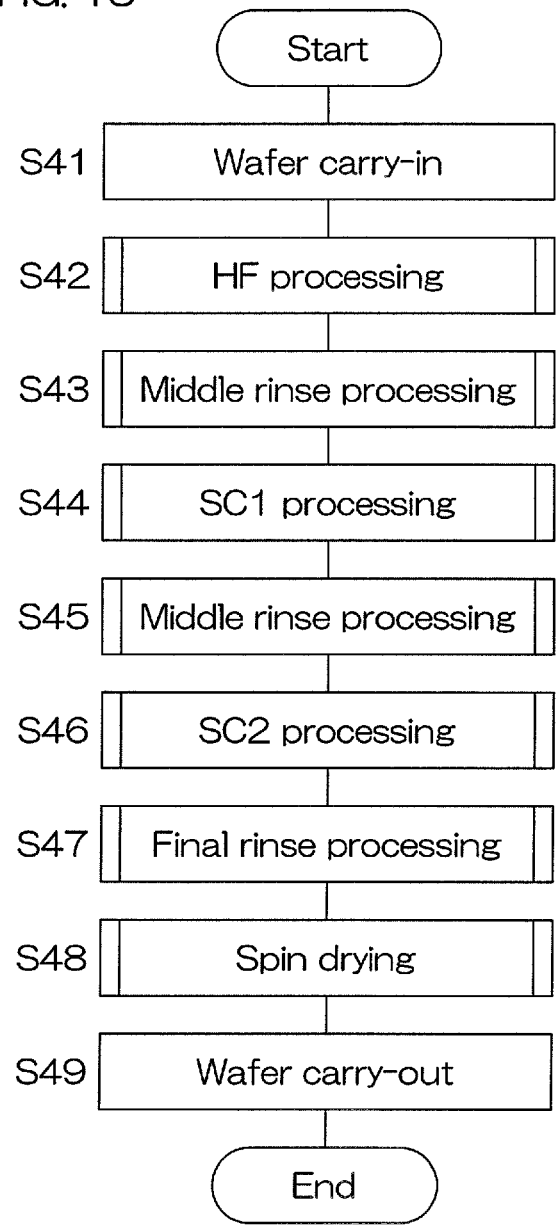
FIG. 13 is a flowchart for illustrating a fifth processing example to be performed in the substrate processing apparatus shown in FIG. 1.

FIG. 13 is a flowchart for illustrating a fifth processing example to be performed in the substrate processing apparatus 1. The fifth processing example is a processing example of a case where the fourth processing example is specifically applied to cleaning processing in which the RCA cleaning method is used. Steps S41, S42, S43, S44, S45, S46, S47, S48, and S49 respectively correspond to Steps, S31, S32, S33, S34, S35, S36, S37, S38, and S39 of FIG. 12. Hereinafter, with reference to FIGS. 1, 2, and 13, only a part of the fifth processing example which is different from the fourth processing example will be described, and other parts will be omitted.

In the processing example, hydrofluoric acid (HF) is used as the first chemical, and SC1 (ammonia-hydrogen peroxide solution mixture) is used as the second chemical. SC2 (hydrochloric acid-hydrogen peroxide solution mixture) is used as the third chemical.

In this case, by selectively opening the first chemical bottom valve 15, hydrofluoric acid is discharged from the lower discharge port 14, and by selectively opening the second chemical bottom valve 16, SC1 is discharged from the lower discharge port 14. By selectively opening the third chemical bottom valve 17, SC2 is discharged from the lower discharge port 14.

For the cleaning processing in which the RCA cleaning method is used, the wafer W is carried into the processing chamber 3 by the transfer arm AR, and held by the upper substrate holding mechanism 5 in a state where the surface of the wafer is directed downward (Step S41).

In HF processing of Step S42, by bringing hydrofluoric acid into contact with the lower face of the wafer W, hydrofluoric acid is distributed over the entire lower face of the wafer W. Thereby, the entire lower face of the wafer W is cleaned and an oxidized film formed on the surface of the wafer W is removed.

In middle rinse processing of Step S43, by bringing the rinse liquid into contact with the lower face of the wafer W, the hydrofluoric acid attached to the lower face of the wafer W is washed away.

At the time of SC1 processing of Step S44, the entire upper face 11 of the lower spin base 8 is heated to 40 to 80° C. by the heater 40 and maintained at the temperature. By opening the second chemical bottom valve 16, SC1 is supplied to the upper face 11 and a SC1 film of 40 to 80° C.

is formed on the upper face 11. By bringing SC1 into contact with the lower face of the wafer W, foreign substances such as particles attached to the lower face of the wafer W can be removed by the chemical ability of SC1. Since the entire SC1 film can be heated by the heater 40, a temperature of the SC1 film can be promptly and uniformly stabilized to be a predetermined temperature. Thereby, in-plane uniformity of the processing in which SC1 is used can be improved.

In middle rinse processing of Step S45, by bringing the rinse liquid into contact with the lower face of the wafer W, the SC1 attached to the lower face of the wafer W is washed away.

At the time of SC2 processing of Step S46, the entire upper face 11 of the lower spin base 8 is heated to 40 to 80° C. by the heater 40 and maintained at the temperature. By opening the third chemical bottom valve 17, SC2 is supplied to the upper face 11 and a SC2 film of 40 to 80° C. is formed on the upper face 11 of the lower spin base 8. By bringing SC2 into contact with the lower face of the wafer W, metal ions attached to the surface of the wafer W can be removed from the surface of the wafer W by the chemical ability of SC2. Since the entire SC2 film can be heated by the heater 40, a temperature of the SC2 film can be promptly and uniformly stabilized to be a predetermined temperature. Thereby, in-plane uniformity of the processing in which SC2 is used can be improved.

In final rinse processing of Step S47, by bringing the rinse liquid into the lower face of the wafer W, the rinse liquid attached to the lower face of the wafer W is washed away.

Next, after performing the spin drying (Step S48 of FIG. 13), the wafer W already subjected to resist removal processing is carried out by the transfer arm AR (Step S49 of FIG. 13).

Figure 14:
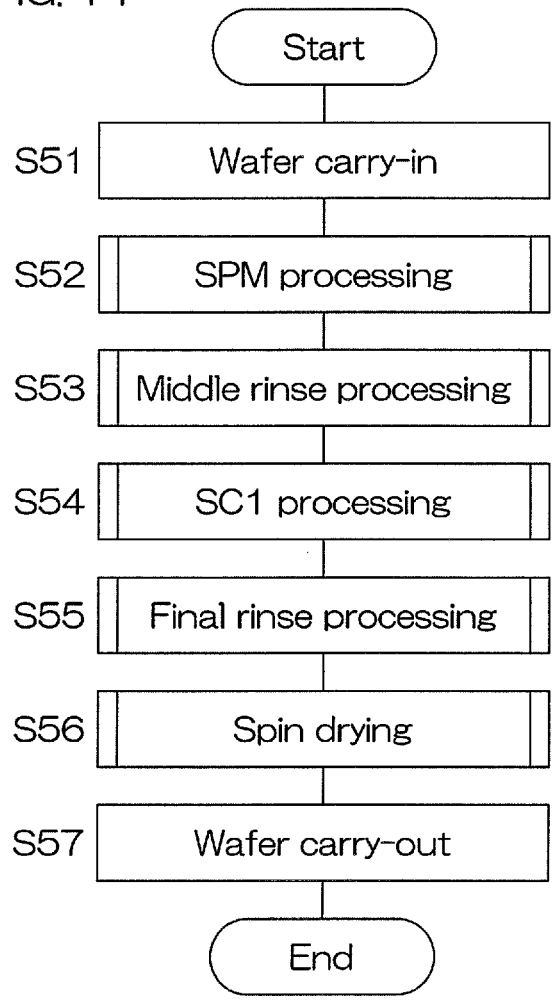
FIG. 14 is a flowchart for illustrating a sixth processing example to be performed in the substrate processing apparatus shown in FIG. 1.

FIG. 14 is a flowchart for illustrating a sixth processing example to be performed in the substrate processing apparatus 1. The sixth processing example is a processing example of a case where the third processing example is specifically applied to the resist removal processing of separating a resist film from the surface of the wafer W. Steps S51, S52, S53, S54, S55, S56, and S57 respectively correspond to Steps S21, S22, S23, S24, S25, S26, and S27 of FIG. 11. Hereinafter, only a part of the sixth processing example which is different from the third processing example will be described, and description of other parts will be omitted.

In the processing example, SPM (sulfuric acid-hydrogen peroxide solution mixture) is used as the first chemical, and SC1 is used as the second chemical. In this case, by selectively opening the first chemical bottom valve 15, SPM is discharged from the lower discharge port 14, and by selectively opening the second chemical bottom valve 16, SC1 is discharged from the lower discharge port 14.

For the resist removal processing, the wafer W already subjected to ion implantation processing is carried into the processing chamber 3 by the transfer arm AR, and held by the upper substrate holding mechanism 5 in a state where the surface of the wafer W is directed downward (Step S51).

At the time of SPM processing of Step S52, the upper face 11 of the lower spin base 8 is heated to a high temperature of 160 to 200° C. by the heater 40 and maintained at the temperature. By opening the first chemical bottom valve 15, SPM is supplied to the upper face 11 and a SPM film of 160 to 200° C. is formed on the upper face 11. By bringing SPM into contact with the lower face of the wafer W, resist formed on the lower face of the wafer W is removed. Since the entire SPM film can be heated by the heater 40, a temperature of the SPM film can be promptly and uniformly stabilized to be a predetermined temperature. Thereby, in-plane uniformity of the processing in which SPM is used can be improved.

In the middle rinse processing of Step S53, the upper face 11 of the lower spin base 8 is heated to about 80° C. by the heater 40 and maintained at the temperature. By opening the rinse liquid bottom valve 18, the rinse liquid is supplied to the upper face 11 and the rinse liquid film 52 of about 80° C. is formed on the upper face 11. By bringing the rinse liquid of about 80° C. into contact with the lower face of the wafer W, the rinse liquid attached to the lower face of the wafer W is washed away. Since the entire rinse liquid film 52 can be heated by the heater 40, a temperature of the rinse liquid film 52 can be promptly and uniformly stabilized to be a predetermined temperature. Thereby, in-plane uniformity of the rinse processing can be improved.

At the time of SC1 processing of Step S54, by bringing SC1 into contact with the lower face of the wafer W, SC1 is distributed over the entire lower face of the wafer W. Thereby, resist residue and foreign substances such as particles attached to the lower face of the wafer W can be removed by the chemical ability of SC1.

In final rinse processing of Step S55, by bringing the rinse liquid into the lower face of the wafer W, the rinse liquid attached to the lower face of the wafer W is washed away. The rinse liquid to be used in the final rinse processing may be a rinse liquid heated to about 80° C. as in the middle rinse processing of Step S53 or may be a room-temperature rinse liquid.

Next, after performing the spin drying (Step S56 of FIG. 14), the wafer W already subjected to the resist removal processing is carried out by the transfer arm AR (Step S57 of FIG. 14).

In addition, in the fifth processing example and the sixth processing example, in a case where the processing temperature of the latter liquid (corresponding to SC2 in a case of the fifth processing example and the rinse liquid in a case of the sixth processing example) is lower than the processing temperature of the former liquid (corresponding to SC1 in a case of the fifth processing example and SPM in a case of the sixth processing example), the latter liquid itself has an action of cooling the lower spin base 8 (upper face 11). Therefore, the temperature of the latter liquid film can be promptly and uniformly stabilized to a predetermined temperature.

In the fifth processing example and the sixth processing example, the heated processing liquid can also be supplied to the upper face 11 heated by the heater 40. In this case, the supplied processing liquid itself has an action of heating and bringing the lower spin base 8 (upper face 11) close to a predetermined temperature. Therefore, the temperature of the processing liquid film can be furthermore promptly and uniformly stabilized to a predetermined temperature.

Figure 15:
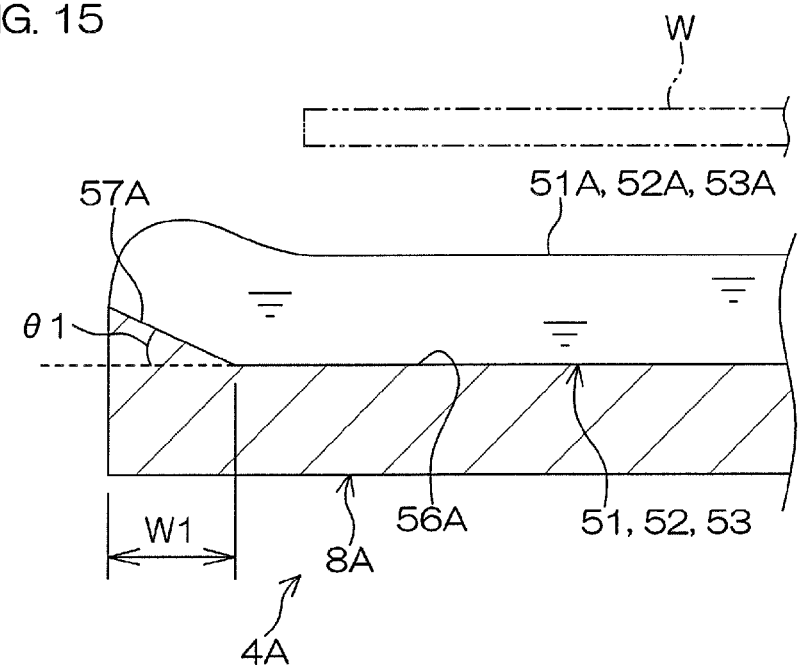
FIG. 15 is a sectional view schematically showing an arrangement of a substrate processing apparatus according to a second preferred embodiment of the present invention.

FIG. 15 is a view of a lower substrate holding mechanism 4A of a substrate processing apparatus according to a second preferred embodiment of the present invention, showing an arrangement of parts corresponding to FIG. 5 described above. The substrate processing apparatus according to the second preferred embodiment is different from the arrangement of the first preferred embodiment in that the lower substrate holding mechanism 4A shown in FIG. 15 is used in place of the lower substrate holding mechanism 4 described above.

The lower substrate holding mechanism 4A of the second preferred embodiment includes: a first opposing face 56A formed in a center portion of a lower spin base 8A, the first opposing face opposing the entire lower face of the wafer W held by the lower substrate holding mechanism 4A or the upper substrate holding mechanism 5; and a ring-shaped first taper face 57A formed continuously to the first opposing face 56A on the outer side of the first opposing face 56A. The first opposing face 56A has a circular flat face which is coaxial with the center of the lower spin base 8A, and the first opposing face 56A has a larger diameter than that of the wafer W. The first taper face 57A has a taper face continuing from an outer peripheral end of the first opposing face 56A and linearly going up toward the outer side in the radial direction, and is formed with rotational symmetry with respect to the center of the lower spin base 8A. A peripheral end of the first taper face 57A is the highest. The first taper face 57A is set by a distance W1 (W1 is, for example, about 3 mm which is similar to or smaller than WO in FIG. 5) from a peripheral end of the wafer W. An inclination angle of the first taper face 57A with respect to the first opposing face 56A is set to be, for example, θ1 (θ1 is, for example, 30°).

In this case, the processing liquid (the first, second, or third chemical, the rinse liquid, or the organic solvent) on the first opposing face 56A can be blocked by the first taper face 57A while narrowing the width of the curved portion 55 in FIG. 5. The processing liquid supplied to the first opposing face 56A can be prevented from flowing out from the upper face 11 of the lower spin base 8A. Thereby, while reducing the amount of the processing liquid (the first, second, or third chemical, the rinse liquid, or the organic solvent) supplied to the first opposing face 56A, a flat region (that is, the upper face 51A, 52A, or 53A) of the film 51, 52, or 53 can be ensured. Thereby, the processing liquid films 51 to 53 on the first opposing face 56A can be efficiently formed.

Figure 16:
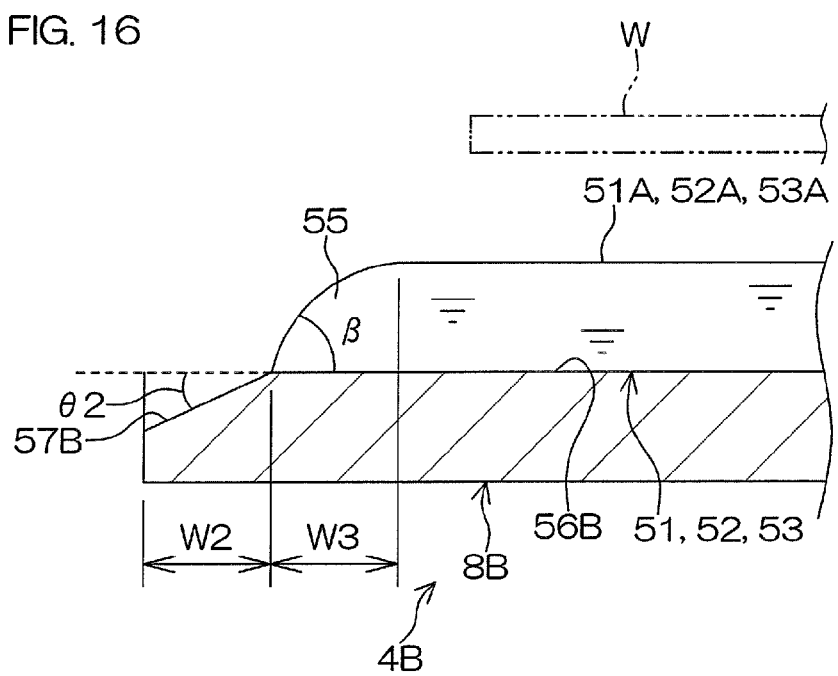
FIG. 16 is a sectional view schematically showing an arrangement of a substrate processing apparatus according to a third preferred embodiment of the present invention.

FIG. 16 is a view of a lower substrate holding mechanism 4B of a substrate processing apparatus according to a third preferred embodiment of the present invention, showing an arrangement of parts corresponding to FIG. 5 described above. The substrate processing apparatus according to the third preferred embodiment is different from the arrangement of the first preferred embodiment in that the lower substrate holding mechanism 4B shown in FIG. 16 is used in place of the lower substrate holding mechanism 4 described above.

The lower substrate holding mechanism 4B of the third preferred embodiment includes: a second opposing face 56B formed in a center portion of a lower spin base 8B, the second opposing face opposing the entire lower face of the wafer W held by the lower substrate holding mechanism 4B or the upper substrate holding mechanism 5; and a ring-shaped second taper face 57B formed in a peripheral edge of the lower spin base 8B. The second opposing face 56B has a circular flat face which is coaxial with the center of the lower spin base 8B, and the second opposing face 56B has a larger diameter than that of the wafer W. The second taper face 57B has a taper face continuing from an outer peripheral end of the second opposing face 56B and linearly going down toward the outer side in the radial direction, and is formed with rotational symmetry with respect to the center of the lower spin base 8B. A peripheral end of the second taper face 57B is the lowest. The second taper face 57B is set by a distance W2 (W2 is, for example, about 3 mm) from the peripheral end of the wafer W. An inclination angle of the second taper face 57B with respect to the second opposing face 56B is set to be, for example, θ2 (θ2 is, for example, 30°).

In this case, by the second taper face 57B, flow-out of the processing liquid (the first, second, or third chemical, the rinse liquid, or the organic solvent) supplied to the second opposing face 56B is facilitated. Thereby, the processing liquid can be smoothly discharged from the second opposing face 56B. Particularly, in a case where the upper face 11 (second opposing face 56B) of the lower spin base 8B has a lyophilic face, formation of the processing liquid films can be facilitated and the film formation time can be shortened.

In addition, in a case where the upper face (second opposing face 56B) of the lower spin base 8B has a hydrophobic face, a pinning effect is exerted on the peripheral end of the second opposing face 56B, and an apparent contact angle β in the peripheral edges of the processing liquid films 51 to 53 (that is, the peripheral end of the second opposing face 56B) is larger than an apparent contact angle α (refer to FIG. 5) of the processing liquid films 51 to 53 on the upper face 11 of a flat face. Therefore, width W3 of the curved portions 55 of the films 51 to 53 can be narrowed down. In this case, the diameter (radius in this case) of flat parts of the upper faces 51A, 52A, 53A of the films 51 to 53 is length determined by subtracting the width W3 of the curved portions 55 from the diameter of the second opposing face 56B. When the diameter of the second opposing face 56B is set so that the diameter of the upper faces 51A, 52A, 53A is larger than the diameter of the wafer W, at the time of contact between the wafer W and the films 51 to 53, the wafer W is brought into contact with the entire upper faces 51A, 52A, 53A of the films 51 to 53.

Figure 17:
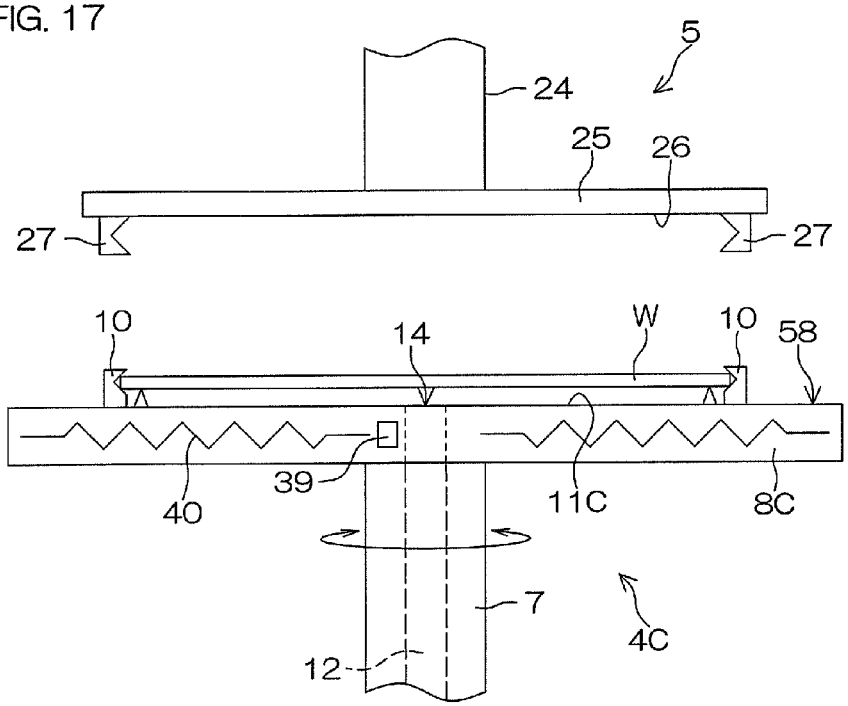
FIG. 17 is a view schematically showing an arrangement of a substrate processing apparatus according to a fourth preferred embodiment of the present invention.
Figure 18:
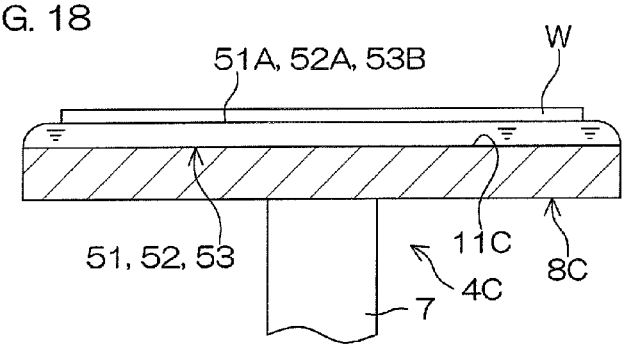
FIG. 18 is a sectional view showing a state where a processing liquid film is formed on an upper face of a lower spin base shown in FIG. 16.

FIG. 17 is a view of a lower substrate holding mechanism 4C of a substrate processing apparatus according to a fourth preferred embodiment of the present invention. FIG. 18 is a sectional view showing a state where a processing liquid film is formed on an upper face 11C of a lower spin base 8C. The substrate processing apparatus according to the fourth preferred embodiment is different from the arrangement of the first preferred embodiment in that the lower substrate holding mechanism 4C shown in FIG. 17 is used in place of the lower substrate holding mechanism 4 described above.

In the lower substrate holding mechanism 4C shown in FIG. 17 and the like, parts corresponding to the parts of the lower substrate holding mechanism 4 of the first preferred embodiment will be given the same reference signs as FIG. 1 and the like, and description thereof will be omitted. The lower substrate holding mechanism 4C of the fourth preferred embodiment is different from the lower substrate holding mechanism 4 of the first preferred embodiment in that the upper face 11C of the lower spin base 8C has a larger circle diameter than the diameter of the wafer W and the diameter of the upper spin base 25. In other words, an annular face 58 having sufficient radial width is formed on the upper face 11C on the outer side of the lower gripping members 10 in the radial direction. Regarding the other points, the lower spin base 8C has the same arrangement as that of the lower spin base 8 of the first preferred embodiment.

In this case, the diameter (radius in this case) of the upper faces 51A to 53A of the films 51 to 53 is length determined by subtracting radial width of the curved portions 55 from the diameter of the second opposing face 56B. When the diameter of the upper face 11C is set so that the diameter of the upper faces 51A to 53A is larger than the diameter of the wafer W, at the time of contact between the wafer W and the films 51 to 53, the wafer W can be brought into contact with the entire upper faces 51A to 53A of the films 51 to 53. Thereby, the entire lower face of the wafer W can be brought into contact with the processing liquid at the same time.

Figure 19:
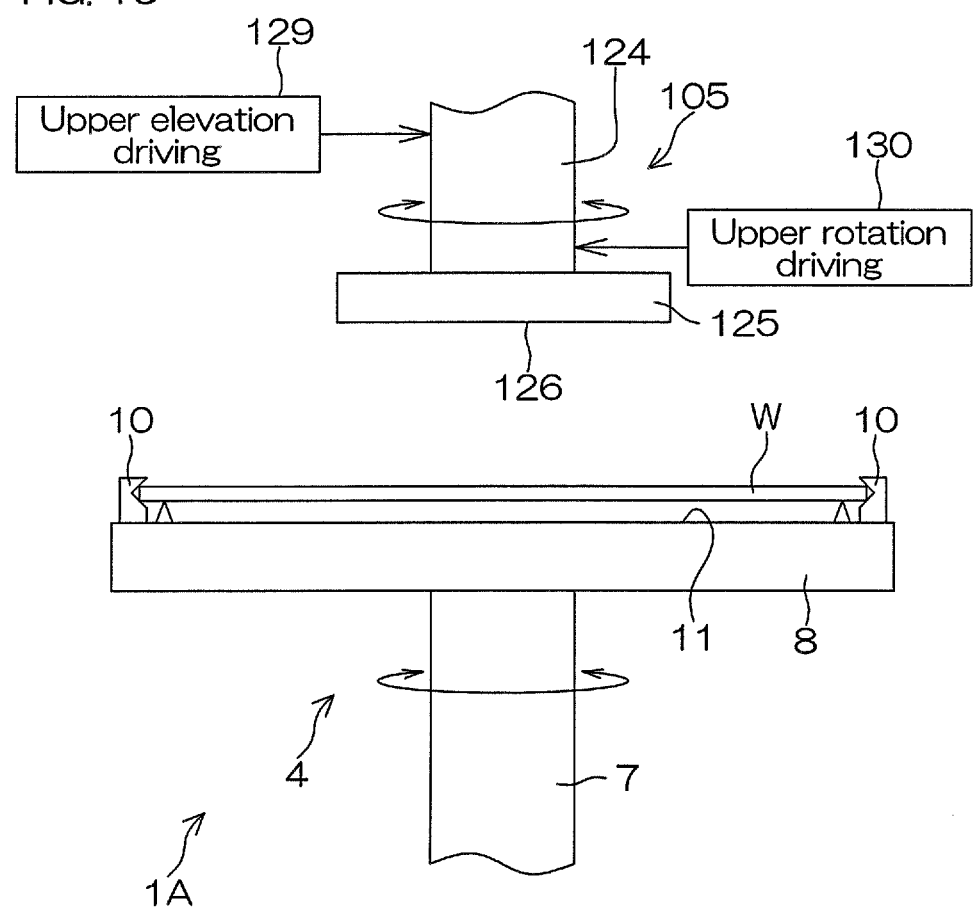
FIG. 19 is a view schematically showing an arrangement of a substrate processing apparatus according to a fifth preferred embodiment of the present invention.
Figure 20A:
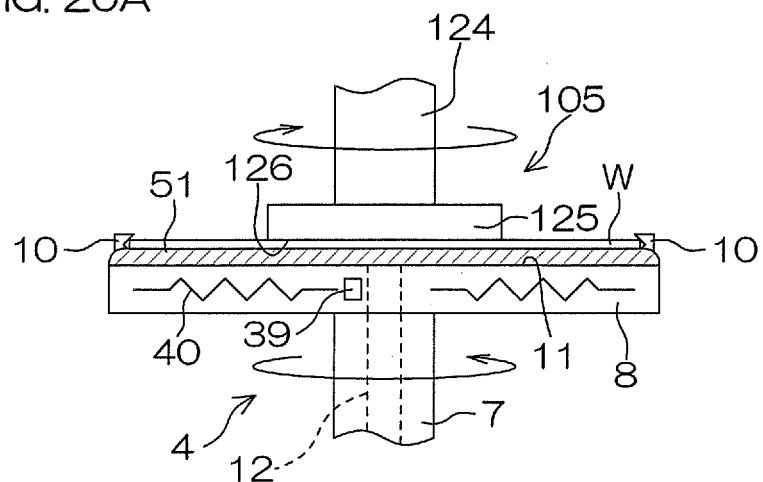
FIGS. 20A-20B are schematic views for illustrating one example of processing to be performed in the substrate processing apparatus shown in FIG. 19.
Figure 20B:
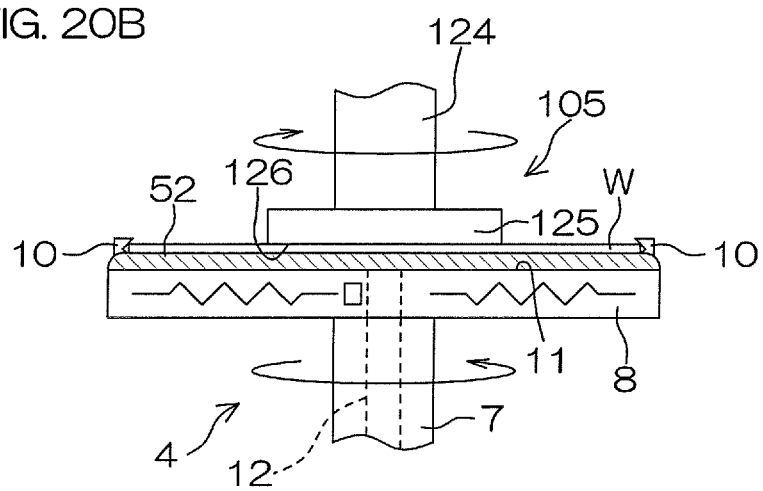

FIG. 19 is a view schematically showing an arrangement of a substrate processing apparatus 1A according to a fifth preferred embodiment of the present invention. FIGS. 20A to 20B are schematic views for illustrating one example of processing to be performed in the substrate processing apparatus 1A.

In the substrate processing apparatus 1A according to the fifth preferred embodiment, parts corresponding to the parts of the substrate processing apparatus 1 of the first preferred embodiment will be given the same reference signs as FIG. 1 and the like, and description thereof will be omitted. The substrate processing apparatus 1A of the fifth preferred embodiment is different from the substrate processing apparatus 1 in that an upper substrate holding mechanism (substrate holding unit) 105 of a vacuum absorption type chuck is provided in place of the upper substrate holding mechanism 5 of a gripping type chuck. The upper substrate holding mechanism 105 includes an upper rotational shaft 124 having the rotation axis which is common to the lower rotational shaft 7 (refer to FIG. 1) (the rotation axis on the same straight line), an upper spin base 125 attached to a lower end of the upper rotational shaft 124, the upper spin base 125 that absorbs and holds the upper face of the wafer W in a substantially horizontal posture. The upper spin base 125 opposes the lower spin base 8 above the lower spin base 8. A lower face 126 of the upper spin base 125 has a substantially horizontal flat downward face and has a smaller diameter than that of the wafer W.

An upper elevation driving mechanism (movement unit) 129 that raises and lowers the upper spin base 125 is combined with the upper rotational shaft 124. An upper rotation driving mechanism 130 including a drive source of a motor and the like is coupled to the upper rotational shaft 124. By inputting driving force from the upper rotation driving mechanism 130 to the upper rotational shaft 124, the upper spin base 125 is rotated. Thereby, the wafer W is rotated about the vertical rotation axis passing through the center of the wafer W (central axis of the upper rotational shaft 124).

While bringing the lower face 126 of the upper spin base 125 into contact with the upper face of the wafer W, the wafer W is held by the upper substrate holding mechanism 105 by vacuum absorption.

In the substrate processing apparatus 1A, the same processing as the processing examples (first to sixth processing examples) can be performed on the wafer W. In this case, an operation shown in FIG. 20A may be performed in the chemical processing (Step S2 (refer to FIG. 1), Step S12 (refer to FIG. 9), Steps S22, S24 (refer to FIG. 11), Steps S32, S34, S36 (refer to FIG. 12), Steps S42, S44, S46 (refer to FIG. 13), Steps S52, S54 (refer to FIG. 14)). That is, after the chemical starts to be brought into contact with the lower face of the wafer W, the upper substrate holding mechanism 105 may continue to hold the wafer W and the wafer W is not necessarily transferred to the lower substrate holding mechanism 4. After the chemical is brought into contact with the lower face of the wafer W, the lower spin base 8 is rotated about the central axis of the lower rotational shaft 7 at predetermined low rotational speed (for example, predetermined rotational speed of 100 rpm or lower). At this time, the upper spin base 125 may be rotated about the central axis of the upper rotational shaft 124 in the direction opposite to the rotation direction of the lower spin base 8 at predetermined low rotational speed (for example, predetermined rotational speed of 100 rpm or lower) together with the wafer W, or may be maintained in a static posture. Thereby, the upper face 11 and the lower face of the wafer W can be relatively rotated, so that the chemical sandwiched between the upper face 11 and the lower face of the wafer W can be furthermore agitated. With such low rotational speed, even when the wafer W is rotated, an air gap is hardly generated in the chemical (chemical film) between the lower face of the wafer W and the upper face 11.

The same operation is applied in the rinse liquid processing (Step S3 (refer to FIG. 1), Step S13 (refer to FIG. 9), Steps S23, S25 (refer to FIG. 11), Steps S33, S35, S37 (refer to FIG. 12), Steps S43, S45, S47 (refer to FIG. 13), Steps S53, S55 (refer to FIG. 14)). That is, after the rinse liquid starts to be brought into contact with the lower face of the wafer W, the upper substrate holding mechanism 105 may continue to hold the wafer W and the wafer W is not necessarily transferred to the lower substrate holding mechanism 4. In this case, after the rinse liquid is brought into contact with the lower face of the wafer W, the lower spin base 8 is rotated about the central axis of the lower rotational shaft 7 at predetermined low rotational speed (for example, predetermined rotational speed of 100 rpm or lower). At this time, the upper spin base 125 may be rotated about the central axis of the upper rotational shaft 124 in the direction opposite to the rotation direction of the lower spin base 8 at predetermined low rotational speed (for example, predetermined rotational speed of 100 rpm or lower) together with the wafer W, or may be maintained in a static posture. Thereby, the upper face 11 and the lower face of the wafer W can be relatively rotated, so that the rinse liquid sandwiched between the upper face 11 and the lower face of the wafer W can be furthermore agitated. With such low rotational speed, even when the wafer W is rotated, an air gap is hardly generated in the rinse liquid (rinse liquid film 52) between the lower face of the wafer W and the upper face 11.

Although the five preferred embodiments of the invention are described above, the invention can be further implemented in other preferred embodiments.

As shown in FIG. 21, in the upper substrate holding mechanism 5 of the first preferred embodiment, an upper discharge port 202 that discharges the dry gas downward may be defined in a center portion of the lower face 26 of the upper spin base 25. The upper rotational shaft 24 is a hollow shaft and an upper face supply pipe 201 is inserted into the upper rotational shaft 24. The upper face supply pipe 201 communicates with a through-hole 203 passing through a center portion of the upper spin base 25 in the thickness direction. The through-hole 203 communicates with the upper discharge port 202 that opens in the center portion of the lower face 26 of the upper spin base 25.

In this case, in the chemical processing shown in FIG. 4D, the rinse processing shown in FIG. 4K, and the organic solvent replacement processing shown in FIG. 10D, by blowing the dry gas from the upper discharge port 202 to the upper face of the wafer W, the chemical, the rinse liquid, and the organic solvent can be prevented from coming around the upper face of the wafer W.

In the spin drying shown in FIGS. 6 and 8, by blowing the dry gas from the upper discharge port 202 to the upper face of the wafer W, the upper face of the wafer W can be promptly dried while preventing re-attachment of splash mist or the like of the chemical or the like.

Pure water (DIW) can be selectively discharged from the upper discharge port 202 in addition to the dry gas.

Figure 22:
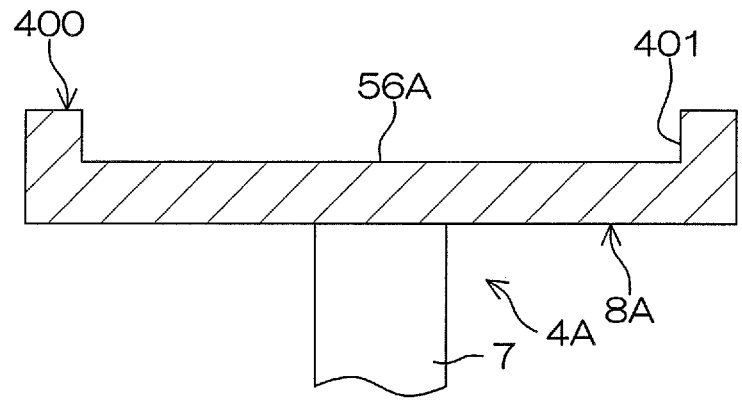
FIG. 22 is a view showing a seventh preferred embodiment of the present invention.

In the second preferred embodiment, as in FIG. 22, a cylinder 400 which is one-step higher than the first opposing face 56A may be formed to surround the first opposing face 56A, an inner peripheral wall of the cylinder may be orthogonal to the first opposing face 56A, and a cylinder face 401 taking the center of the first opposing face 56A as the center thereof may be formed. In this case, the processing liquid from the first opposing face 56A can be blocked by the cylinder face 401, so that the processing liquid (the first, second, or third chemical, the rinse liquid, or the organic solvent) supplied to the first opposing face 56A can be more effectively prevented from flowing out from the upper face 11 of the lower spin base 8A. Thereby, the formation of the processing liquid films 51 to 53 on the first opposing face 56A can be facilitated and the use amount of the processing liquid can be reduced.

Figure 23:
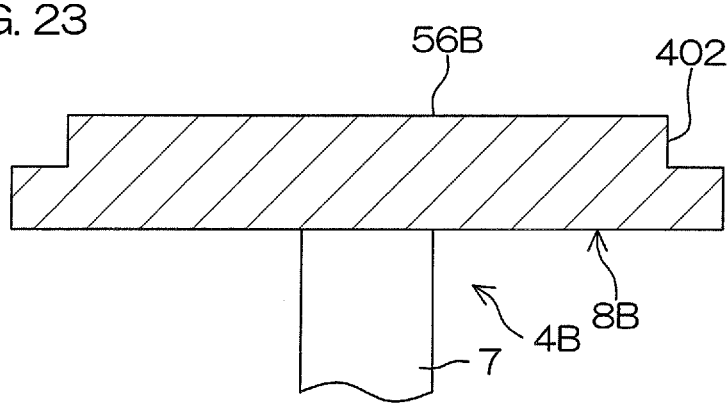
FIG. 23 is a view showing an eighth preferred embodiment of the present invention.
Figure 24:
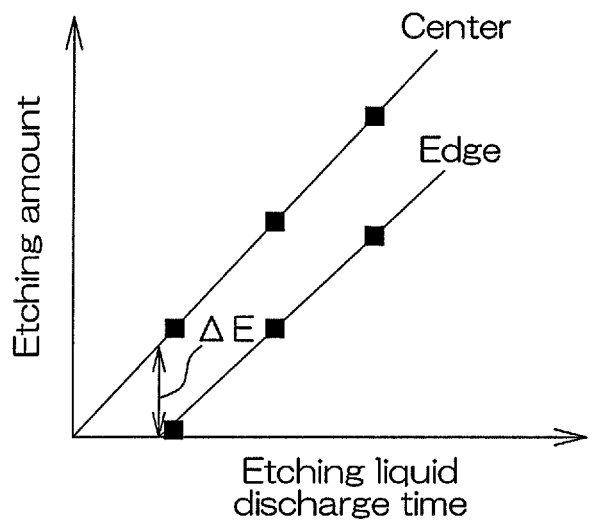
FIG. 24 is a model diagram for illustrating a difference in the etching processing amount between the rotation center (center) and a peripheral end (edge) of a substrate in a case where an etching liquid is used as a processing liquid (in a case where substrate rotational speed is relatively low).
Figure 25:
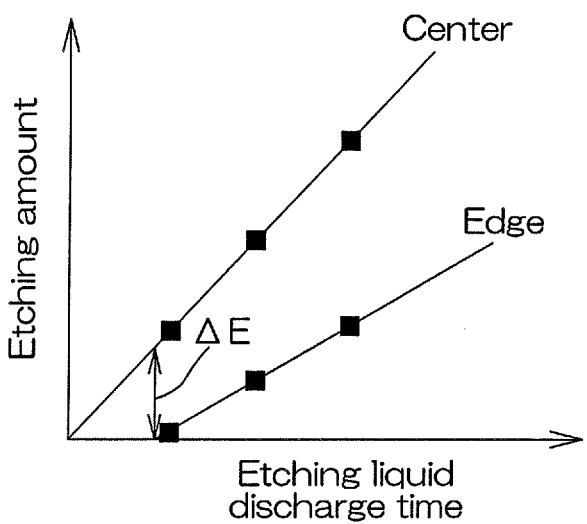
FIG. 25 is a model diagram for illustrating a difference in the etching processing amount between the rotation center (center) and the peripheral end (edge) of the substrate in a case where the etching liquid is used as the processing liquid (in a case where the substrate rotational speed is relatively high).

In the third preferred embodiment, as in FIG. 23, an annular step portion 402 orthogonal to the second opposing face 56B, the annular step portion 402 connecting to a peripheral end face of the lower spin base 8B may be formed on a peripheral end face of the second opposing face 56B. In this case, flow-out of the processing liquid (the first, second, or third chemical, the rinse liquid, or the organic solvent) supplied to the second opposing face 56B is facilitated by the annular step portion 402. Thereby, the processing liquid can be smoothly discharged from the second opposing face 56B. Particularly, in a case where the upper face (second opposing face 56B) of the lower spin base 8B has a lyophilic face, the formation of the processing liquid films can be facilitated and the processing liquid amount can be reduced.

In addition, although the arrangement that the detection output of the temperature sensor 39 is input to the control unit 50 and the control unit 50 controls the heater 40 based on the detection output is shown as an example, the detection output of the temperature sensor 39 may be input to an external temperature regulator (not shown) and the temperature regulator may control the heater 40 based on the detection output.

In the preferred embodiments described above, the transfer position (the position shown in FIG. 4A and the like) of the upper substrate holding mechanism 5, 105 is set on the upper side of the distant position (the position shown in FIG. 4D and the like). However, the transfer position may be set between the proximal position (the position shown in FIG. 4C and the like) and the distant position, or the transfer position may be set at the same position as the distant position. In a case where the distant position and the transfer position are set to be the same position, positions at which the upper substrate holding mechanism 5, 105 is disposed can also be set to only two points of the distant position (transfer position) and the proximal position. In this case, elevation control of the upper substrate holding mechanism 5 can be easily performed.

A nozzle having a discharge port that opposes the upper face 11 of the lower spin base 8 may be provided and the processing liquid (the chemical (the first to third chemicals), the rinse liquid, and the organic solvent) may be supplied from the nozzle toward the upper face 11 of the lower spin base 8. Specifically, the processing liquid may be supplied from a fixed nozzle having a discharge port directed toward the upper face 11.

Further, the processing liquid (the chemical (the first to third chemicals), the rinse liquid, and the organic solvent) supplied to the upper face 11 of the lower spin base 8 does not necessarily have a room temperature but may be appropriately heated before being supplied.

The substrate processing apparatus 1, 1A described above includes the arrangement that the three chemicals of the first chemical, the second chemical, and the third chemical can be supplied to the upper face 11 for convenience of explanation. However, the number of types of chemicals can be appropriately selected in accordance with the processing to be performed in the substrate processing apparatus. Although the substrate processing apparatus 1, 1A described above includes the arrangement that the organic solvent can be supplied, adoption of the arrangement that the organic solvent can be supplied can be appropriately selected in accordance with the processing to be performed in the substrate processing apparatus.

In accordance with contents of the processing on the surface of the wafer W, chemicals other than the chemicals described above can also be used as the chemicals.

In the preferred embodiments, DIW is taken as an example of the rinse liquid. However, the rinse liquid is not limited to DIW but carbonated water, electrolyzed ion water, ozone water, aqueous hydrochloric acid of dilute concentration (for example, about 10 to 100 ppm), regenerated water (hydrogen water), or the like can also be adopted as the rinse liquid.

The nitrogen gas serving as one example of the inert gas is taken as an example of the dry gas. However, as the inert gas, for example, an argon gas, a helium gas, or the like can be used in addition to the nitrogen gas.

As the organic solvent having a smaller contact angle than that of water, for example, a liquid containing at least one of HFE (hydrofluoroether), methanol, ethanol, acetone, and trans-1,2-dichloroethene, or the like can be used in addition to IPA.

Further, although the example of performing the processing of the circular substrate is described in the preferred embodiments described above, the invention can also be applied to processing of a square substrate.

Although the preferred embodiments of the present invention have been described in detail, these preferred embodiments are merely concrete examples used to clarify the technical contents of the present invention, and the present invention should not be understood by being limited to these concrete examples, and the scope of the present invention is limited solely by the appended claims.

The present application corresponds to Japanese Patent Application No. 2012-79913 filed in the Japan Patent Office on Mar. 30, 2012, and the entire disclosure of the application is incorporated herein by reference.

DESCRIPTION OF REFERENCE SIGNS

1, 1A: Substrate processing apparatus
5, 105: Upper substrate holding mechanism (substrate holding unit)
8, 8A, 8B, 8C: Lower spin base
11: Upper face (liquid holding face)
14: Lower discharge port (processing liquid discharge port, chemical discharge port, rinse liquid discharge port, dry gas discharge port)
15: First chemical bottom valve (chemical supply unit)
16: Second chemical bottom valve (chemical supply unit)
17: Third chemical bottom valve (chemical supply unit)
18: Rinse liquid bottom valve (rinse liquid supply unit)
19: Dry gas bottom valve
20: Organic solvent bottom valve (processing liquid supply unit)
29, 129: Upper elevation driving mechanism (movement unit)
40: Heater (heating unit)
50: Control unit
50*a*: Low speed rotation control unit
50*b*: High speed rotation control unit
50*c*: Processing liquid supply control unit
51: First chemical film (chemical film)
52: Rinse liquid film (rinse liquid film)
W: Wafer (substrate)

The invention claimed is:

1. A substrate processing apparatus comprising:
a substrate holding unit that holds a substrate in a horizontal posture;
a plate that has a size equal to or larger than a principal face of the substrate held by the substrate holding unit, and has a horizontal and flat liquid holding face opposing the principal face of the substrate from below the principal face;
a processing liquid supply unit that supplies a processing liquid to the liquid holding face;
a movement unit that relatively moves the substrate holding unit and the plate to bring or separate the principal face of the substrate and the liquid holding face close to or from each other; and
a control unit that controls the processing liquid supply unit and the movement unit to execute a processing liquid film forming step of supplying the processing liquid to the liquid holding face by the processing liquid supply unit to form a processing liquid film on the liquid holding face, a contact step of bringing the principal face of the substrate and the liquid holding face close to each other by the movement unit to bring the principal face of the substrate into contact with the processing liquid film, and a liquid contact maintenance step of maintaining a state where the processing liquid is in contact with the principal face of the substrate after the contact step.

2. The substrate processing apparatus according to claim 1, wherein a processing liquid discharge port that discharges the processing liquid is defined on the liquid holding face, and
the processing liquid supply unit discharges the processing liquid from the processing liquid discharge port.

3. The substrate processing apparatus according to claim 1, further comprising: a plate rotation unit that rotates the plate about a rotation axis perpendicular to the liquid holding face.

4. The substrate processing apparatus according to claim 3, wherein the control unit includes a low speed rotation control unit that controls the plate rotation unit to rotate the plate at a low rotational speed with which the processing liquid is capable of being held between the liquid holding face and the principal face of the substrate in parallel with the liquid contact maintenance step.

5. The substrate processing apparatus according to claim 3, wherein the control unit includes a high speed rotation control unit that controls the plate rotation unit to rotate the plate at a high rotational speed with which the processing liquid is capable of being shaken off the liquid holding face after finishing the liquid contact maintenance step.

6. The substrate processing apparatus according to claim 1, wherein the control unit includes a unit that stops supply of the processing liquid to the liquid holding face in synchronization with execution of the contact step or before the execution of the contact step.

7. The substrate processing apparatus according to claim 1, wherein a dry gas discharge port that discharges a dry gas is defined on the liquid holding face.

8. The substrate processing apparatus according to claim 1, further comprising: a heating unit that heats the liquid holding face.

9. The substrate processing apparatus according to claim 1, wherein the processing liquid supply unit includes a chemical supply unit that supplies a chemical to the liquid holding face, and a rinse liquid supply unit that supplies a rinse liquid to the liquid holding face, and the control unit controls the chemical supply unit, the rinse liquid supply unit, and the movement unit to execute a chemical film forming step of supplying the chemical to the liquid holding face by the chemical supply unit to form a chemical film on the liquid holding face, a chemical contact step of bringing the principal face of the substrate and the liquid holding face close to each other by the movement unit to bring the principal face of the substrate into contact with the chemical film, a chemical contact maintenance step of maintaining a state where the chemical is in contact with the principal face of the substrate after the chemical contact step, a separation step of separating the principal face of the substrate and the liquid holding face from each other by the movement unit, a rinse liquid film forming step of supplying the rinse liquid to the liquid holding face by the rinse liquid supply unit after the separation step to form a rinse liquid film on the liquid holding face, a rinse liquid contact step of bringing the principal face of the substrate and the liquid holding face close to each other by the movement unit to bring the principal face of the substrate into contact with the rinse liquid film, and a rinse liquid contact maintenance step of maintaining a state where the rinse liquid is in contact with the principal face of the substrate after the rinse liquid contact step.

10. The substrate processing apparatus according to claim 1, wherein the processing liquid supply unit includes a first chemical supply unit that supplies a first chemical to the liquid holding face, and a second chemical supply unit that supplies a second chemical to the liquid holding face, and
the control unit controls the first chemical supply unit, the second chemical supply unit, and the movement unit to execute a first chemical film forming step of supplying the first chemical to the liquid holding face by the first chemical supply unit to form a first chemical film on the liquid holding face, a first chemical contact step of bringing the principal face of the substrate and the liquid holding face close to each other by the movement unit to bring the principal face of the substrate into contact with the first chemical film, a first chemical contact maintenance step of maintaining a state where the first chemical is in contact with the principal face of the substrate after the first chemical contact step, a separation step of separating the principal face of the substrate and the liquid holding face from each other by the movement unit, a second chemical film forming step of supplying the second chemical to the liquid holding face by the second chemical supply unit after the separation step to form a second chemical film on the liquid holding face, a second chemical contact step of bringing the principal face of the substrate and the liquid holding face close to each other by the movement unit to bring the principal face of the substrate into contact with the second chemical film, and a second chemical contact maintenance step of maintaining a state where the second chemical is in contact with the principal face of the substrate after the second chemical contact step.

11. A substrate processing method to be executed in a substrate processing apparatus including a substrate holding unit that holds a substrate in a horizontal posture, comprising:
a liquid film forming step of supplying a processing liquid to a horizontal and flat liquid holding face opposing a principal face of the substrate from below the principal face to form a processing liquid film on the liquid holding face;

a contact step of bringing the principal face of the substrate and the liquid holding face close to each other to bring the principal face of the substrate into contact with the processing liquid film; and a liquid contact maintenance step of maintaining a state where the processing liquid is in contact with the principal face of the substrate after the contact step.

12. The substrate processing method according to claim 11, wherein a processing liquid discharge port that discharges the processing liquid is defined on the liquid holding face, and the liquid film forming step includes a step of discharging the processing liquid from the processing liquid discharge port.

13. The substrate processing method according to claim 11, further comprising: a substrate rotation step of holding the substrate on a plate that provides the liquid holding face and rotating the substrate about a rotation axis perpendicular to the liquid holding face together with the plate.

14. The substrate processing method according to claim 13, wherein the substrate rotation step is executed in parallel with the liquid contact maintenance step, and the plate is rotated at a low rotational speed with which the processing liquid is capable of being held between the liquid holding face and the principal face of the substrate.

15. The substrate processing method according to claim 13, further comprising: a step of rotating the plate at a high rotational speed with which the processing liquid is capable of being shaken off the liquid holding face after finishing the liquid contact maintenance step.

16. The substrate processing method according to claim 11, comprising: a step of stopping supply of the processing liquid to the liquid holding face in synchronization with execution of the contact step or before the execution of the contact step.

17. The substrate processing method according to claim 11, further comprising: a step of discharging a dry gas from a dry gas discharge port defined on the liquid holding face.

18. The substrate processing method according to claim 11, further comprising: a heating step of heating the liquid holding face.

19. The substrate processing method according to claim 11, wherein the liquid film forming step includes a chemical film forming step of supplying a chemical to the liquid holding face to form a chemical film, and a rinse liquid film forming step of supplying a rinse liquid to the liquid holding face to form a rinse liquid film, the contact step includes a chemical contact step of bringing the principal face of the substrate and the liquid holding face close to each other to bring the principal face of the substrate into contact with the chemical film, and a rinse liquid contact step of bringing the principal face of the substrate and the liquid holding face close to each other to bring the principal face of the substrate into contact with the rinse liquid film, the liquid contact maintenance step includes a chemical contact maintenance step of maintaining a state where the chemical is in contact with the principal face of the substrate, and a rinse liquid contact maintenance step of maintaining a state where the rinse liquid is in contact with the principal face of the substrate, the chemical contact step is executed after the chemical film forming step, the chemical contact maintenance step is executed after the chemical contact step, a separation step of separating the principal face of the substrate and the liquid holding face from each other is executed after the chemical contact maintenance step, the rinse liquid film forming step is executed after the separation step, the rinse liquid contact step is executed after the rinse liquid film forming step, and the rinse liquid contact maintenance step is executed after the rinse liquid contact step.

20. The substrate processing method according to claim 11, wherein the liquid film forming step includes a first chemical film forming step of supplying a first chemical to the liquid holding face to form a first chemical film, and a second chemical film forming step of supplying a second chemical to the liquid holding face to form a second chemical film, the contact step includes a first chemical contact step of bringing the principal face of the substrate and the liquid holding face close to each other to bring the principal face of the substrate into contact with the first chemical film, and a second chemical contact step of bringing the principal face of the substrate and the liquid holding face close to each other to bring the principal face of the substrate into contact with the second chemical film, the liquid contact maintenance step includes a first chemical contact maintenance step of maintaining a state where the first chemical is in contact with the principal face of the substrate, and a second chemical contact maintenance step of maintaining a state where the second chemical is in contact with the principal face of the substrate, the first chemical contact step is executed after the first chemical film forming step, the first chemical contact maintenance step is executed after the first chemical contact step, a separation step of separating the principal face of the substrate and the liquid holding face from each other is executed after the first chemical contact maintenance step, the second chemical film forming step is executed after the separation step, the second chemical contact step is executed after the second chemical film forming step, and the second chemical contact maintenance step is executed after the second chemical contact step.

* * * * *